(12) United States Patent
Mojab

(10) Patent No.: US 11,804,835 B2
(45) Date of Patent: Oct. 31, 2023

(54) METHOD AND SYSTEM OF OPERATING A BI-DIRECTIONAL DOUBLE-BASE BIPOLAR JUNCTION TRANSISTOR (B-TRAN)

(71) Applicant: IDEAL POWER INC., Austin, TX (US)

(72) Inventor: Alireza Mojab, Austin, TX (US)

(73) Assignee: IDEAL POWER INC., Austin, TX (US)

(*) Notice: Subject to any disclaimer, the term of this patent is extended or adjusted under 35 U.S.C. 154(b) by 0 days.

(21) Appl. No.: 17/530,981

(22) Filed: Nov. 19, 2021

(65) Prior Publication Data
US 2022/0077852 A1 Mar. 10, 2022

Related U.S. Application Data

(63) Continuation of application No. 17/317,466, filed on May 11, 2021, now Pat. No. 11,411,557.
(Continued)

(51) Int. Cl.
*H03K 17/66* (2006.01)
*H01L 29/747* (2006.01)

(52) U.S. Cl.
CPC .......... *H03K 17/668* (2013.01); *H01L 29/747* (2013.01)

(58) Field of Classification Search
None
See application file for complete search history.

(56) References Cited

U.S. PATENT DOCUMENTS 9,029,909 B2* 5/2015 Blanchard ........... H01L 29/0649
257/129
9,035,350 B2 5/2015 Blanchard et al.
(Continued)

FOREIGN PATENT DOCUMENTS

CN 105308750 A 2/2016
EP 2954557 B1 12/2015
(Continued)

OTHER PUBLICATIONS

EP Search Report for EP Application No. 21174080.8, dated Oct. 18, 2021, 12 pages.
(Continued)

*Primary Examiner* — Thomas J. Hiltunen
*Assistant Examiner* — Khareem E Almo
(74) *Attorney, Agent, or Firm* — Dickinson Wright PLLC; Mark E. Scott

(57) ABSTRACT

Operating a bi-directional double-base bipolar junction transistor (B-TRAN). One example is a method comprising: injecting charge carriers at a first rate into an upper base of the transistor, the injecting at the first rate results in current flow through the transistor from an upper collector-emitter to a lower collector-emitter, and the current flow results in first voltage drop measured across the upper collector-emitter and the lower collector-emitter; and then, within a predetermined period of time before the end of a first conduction period of the transistor, injecting charge carriers into the upper base at a second rate lower than the first rate, the injecting at the second rate results in second voltage drop measured across the upper collector-emitter and the lower collector-emitter, the second voltage drop higher than the first voltage drop; and then making the transistor non-conductive at the end of the conduction period.

19 Claims, 11 Drawing Sheets

Related U.S. Application Data

(60) Provisional application No. 63/026,597, filed on May 18, 2020.

(56) References Cited

U.S. PATENT DOCUMENTS

| | | | |
|---|---|---|---|
| 9,054,706 B2 | 6/2015 | Blanchard et al. | |
| 9,054,707 B2 | 6/2015 | Blanchard et al. | |
| 9,059,710 B2 | 6/2015 | Blanchard et al. | |
| 9,190,894 B2 | 11/2015 | Blanchard et al. | |
| 9,203,400 B2 | 12/2015 | Blanchard et al. | |
| 9,203,401 B2 | 12/2015 | Blanchard et al. | |
| 9,209,713 B2 | 12/2015 | Blanchard et al. | |
| 9,209,798 B2 | 12/2015 | Blanchard et al. | |
| 9,231,582 B1 | 1/2016 | Blanchard et al. | |
| 9,337,262 B2 | 5/2016 | Blanchard et al. | |
| 9,355,853 B2 | 5/2016 | Blanchard et al. | |
| 9,356,595 B2 | 5/2016 | Blanchard et al. | |
| 9,369,125 B2 | 6/2016 | Blanchard et al. | |
| 9,374,084 B2 | 6/2016 | Blanchard et al. | |
| 9,374,085 B2 | 6/2016 | Blanchard et al. | |
| 9,444,449 B2 | 9/2016 | Bundschuh et al. | |
| 9,614,028 B2 | 4/2017 | Blanchard et al. | |
| 9,647,553 B2 | 5/2017 | Blanchard et al. | |
| 9,660,551 B2 | 5/2017 | Blanchard et al. | |
| 9,679,999 B2 | 6/2017 | Blanchard et al. | |
| 9,742,385 B2 * | 8/2017 | Alexander | H01L 29/0821 |
| 9,742,395 B2 * | 8/2017 | Alexander | H01L 29/7416 |
| 9,786,773 B2 | 10/2017 | Blanchard et al. | |
| 9,787,298 B2 | 10/2017 | Blanchard et al. | |
| 9,787,304 B2 | 10/2017 | Blanchard et al. | |
| 9,799,731 B2 * | 10/2017 | Alexander | H01L 29/7375 |
| 9,818,615 B2 | 11/2017 | Blanchard et al. | |
| 9,899,868 B2 * | 2/2018 | Bundschuh | H02J 3/32 |
| 9,900,002 B2 * | 2/2018 | Alexander | H01L 29/1004 |
| 10,056,372 B2 | 8/2018 | Blanchard et al. | |
| 10,211,283 B2 | 2/2019 | Blanchard et al. | |
| 10,418,471 B2 | 9/2019 | Blanchard et al. | |
| 10,497,699 B2 | 12/2019 | Blanchard et al. | |
| 10,580,885 B1 | 3/2020 | Blanchard et al. | |
| 10,892,354 B2 | 1/2021 | Blanchard et al. | |
| 2015/0054552 A1 * | 2/2015 | Blanchard | H01L 29/7375 |
| | | | 327/109 |
| 2016/0005732 A1 | 1/2016 | Wood | |
| 2016/0344300 A1 | 11/2016 | Alexander | |
| 2017/0287721 A1 | 10/2017 | Wood | |
| 2018/0130898 A1 | 5/2018 | Blanchard et al. | |
| 2019/0043969 A1 | 2/2019 | Wood | |
| 2019/0097031 A1 * | 3/2019 | Alexander | H01L 29/732 |
| 2019/0363196 A1 | 11/2019 | Wood | |
| 2020/0111672 A1 | 4/2020 | Blanchard et al. | |
| 2020/0321455 A1 * | 10/2020 | Wood | H01L 29/0821 |

FOREIGN PATENT DOCUMENTS

| | | | |
|---|---|---|---|
| GB | 2510716 A | 8/2014 | |
| GB | 2524699 A | 9/2015 | |
| GB | 2546475 A | 7/2017 | |
| GB | 2572702 A | 10/2019 | |
| TW | 201834373 A | 9/2018 | |
| WO | 2014122472 A1 | 8/2014 | |
| WO | 2016073957 A1 | 5/2016 | |
| WO | 2018109452 A1 | 6/2018 | |

OTHER PUBLICATIONS

"B-Tran—Bi-Directional Bi-Polar Junction TRANsistor"; White Paper (2), Apr. 2016, idealpower.com, p. 1-11.

"B-Tran—Bi-Directional Bi-Polar Junction TRANsistor"; Ideal Power White Paper WHT-00002 Rev C; Apr. 2016; 11 pages; published by Ideal Power, idealpower.com.

* cited by examiner

METHOD AND SYSTEM OF OPERATING A BI-DIRECTIONAL DOUBLE-BASE BIPOLAR JUNCTION TRANSISTOR (B-TRAN)

CROSS-REFERENCE TO RELATED APPLICATIONS

This application is a continuation of U.S. application Ser. No. 17/317,466 filed May 11, 2021 titled "METHOD AND SYSTEM OF OPERATING A BI-DIRECTIONAL DOUBLE-BASE BIPOLAR JUNCTION TRANSISTOR (B-TRAN)" (now U.S. Pat. No. 11,411,557). The '446 application claims the benefit of U.S. Provisional App. No. 63/026,597 filed May 18, 2020 titled "Modulation of External Power Supply to Improve B-TRAN Performance." Both applications are incorporated by reference herein as if reproduced in full below.

BACKGROUND

A bi-directional double-base bipolar junction transistor (hereafter B-TRAN) is junction transistor constructed with a base and collector-emitter on a first side of the bulk region, and a distinct and separate base and collector-emitter on a second side of the bulk region opposite the first side. When properly configured by an external driver, electrical current may selectively flow through a B-TRAN in either direction, and thus B-TRAN devices are considered bi-directional devices. Based on the bi-directionality, whether a collector-emitter is considered a collector (e.g., current flow into the B-TRAN) or an emitter (e.g., current flow out of the B-TRAN) depends on the applied external voltage and thus the direction of current flow through the B-TRAN. When a particular collector-emitter is acting as a collector, the base on the same side of the bulk region may be referred as a collector-side base or c-base. Relatedly when a particular collector-emitter is acting as an emitter, the base on the same side of the bulk region may be referred as an emitter-side base or e-base. Consider current flow through a B-TRAN device in a particular direction, such as from an upper collector-emitter to a lower collector-emitter. In such a situation, the upper collector-emitter acts a collector, and the lower collector-emitter acts as an emitter.

A B-TRAN may have varying conduction modes and corresponding forward voltage drops. For example, in a diode-on mode, the upper base or c-base may be directly coupled to the upper collector-emitter, and the lower base or e-base may be electrically floated. In the example diode-on mode, the forward voltage drop across the B-TRAN may be about a forward voltage drop for a silicon-based diode (e.g., about 1.0V). However, in the example situation of current flow from an upper collector-emitter to a lower collector-emitter in a transistor-on mode, the forward voltage drop may be reduced (e.g., to between about 0.2V and 0.3V, inclusive) by increasing the voltage at the upper base relative to the upper collector-emitter. The transistor-on mode, while having benefits in terms of a lower forward voltage drop, also has increased turn-off time to make the B-TRAN non-conductive.

SUMMARY

One example is a method of operating a bi-directional double-base bipolar junction transistor, the method comprising: injecting charge carriers at a first rate into an upper base of the transistor, the injecting at the first rate results in current flow through the transistor from an upper collector-emitter to a lower collector-emitter, and the current flow results in a first voltage drop measured across the upper collector-emitter and the lower collector-emitter; and then, within a predetermined period of time before the end of a first conduction period of the transistor, injecting charge carriers into the upper base at a second rate lower than the first rate, the injecting at the second rate results in second voltage drop measured across the upper collector-emitter and the lower collector-emitter, the second voltage drop higher than the first voltage drop; and then making the transistor non-conductive at the end of the first conduction period.

In the example method, making the transistor non-conductive may further comprise directly coupling a lower base of the transistor to the lower collector-emitter of the transistor, and extracting charge carriers from the upper base. After extracting charge carrier from the upper base, the example method may comprise electrically floating the upper base.

The example method may further comprise, prior to injecting charger carriers at the first rate, injecting charge carriers into the upper base at a third rate higher than the first rate, the injecting charge carriers at the third rate to decrease switching time from the off-mode to a conductive state of the transistor.

In the example method, making the transistor non-conductive may further comprise: ceasing the injecting charge carriers into the upper base; electrically floating the upper base; and directly coupling a lower base of the transistor to the lower collector-emitter of the transistor.

In the example method, injecting charge carriers at the first rate through the upper base may further comprise coupling a first voltage source between the upper collector-emitter and the upper base. Injecting charge carriers at the second rate through the upper base may further comprise coupling a second voltage source between the upper collector-emitter and the upper base, the second voltage source distinct from the first voltage source. Injecting charge carriers at the second rate through the upper base may further comprise lowering an output voltage of the first voltage source.

In the example method, injecting charge carriers at the first rate through the upper base may further comprise coupling a first current source between the upper collector-emitter to the upper base. Injecting charge carriers at the second rate through the upper base may further comprise coupling a second current source between the upper collector-emitter and the upper base. Injecting charge carriers at the second rate through the upper base may further comprise lowering current output of the first current source.

The example method may further comprise, prior to injecting charge carriers at the first rate, making the transistor conductive by directly coupling the upper collector-emitter the upper base.

In the example method, the first voltage drop may be less 0.2 Volts or less, and the second voltage drop may be greater than 0.4 Volts.

The example method may further comprise, after the making the transistor non-conductive: injecting charge carriers at a third rate into the lower base of the transistor, the injecting at the third rate results in current flow through the transistor from the lower collector-emitter to the upper collector-emitter, and the current flow results in third voltage drop across the lower collector-emitter and the upper collector-emitter; and then, within a predetermined period of the end of a second conduction period, injecting charge carriers into the lower base at a fourth rate lower than the third rate, the injecting at the fourth rate results in fourth voltage drop measured across the lower collector-emitter and the upper collector-emitter, the fourth voltage drop higher than the third voltage drop; and then making the transistor non-conductive at the end of the second conduction period.

Another example is a switch assembly comprising: a bipolar junction transistor defining an upper base, an upper collector-emitter, a lower base, and a lower collector-emitter; a driver defining an upper-base terminal coupled to the upper base, an upper conduction terminal coupled to the upper collector-emitter, a lower base terminal coupled to the lower base, and a lower-conduction terminal coupled to the lower collector-emitter. The driver may be configured to: inject charge carriers at a first rate into the upper base, the injecting charge carriers at the first rate results a first conductivity through the transistor from the upper collector-emitter to the lower collector-emitter; predict the end of a first conduction period, and within a predetermined period of time before the end of the first conduction period, inject charge carriers into the upper base at a second rate lower than the first rate, the injecting charge carriers at the second rate results in second conductivity through the transistor from the upper collector-emitter and to the lower collector-emitter, the second conductivity lower than the first conductivity; and then make the transistor non-conductive at the end the first conduction period.

In the example switch assembly, the driver may further comprise: a controller; a first voltage source defining a first voltage output; and a first electrically-controlled switch defining a first connection coupled to the first voltage output, a second connection coupled to the upper base, and a first control input coupled to the controller. When the driver injects charge carriers at the first rate into the upper base, the controller may be configured to make the first electrically-controlled switch conductive by asserting the first control input.

The example switch assembly may further comprise: a second voltage source defining a second voltage output, the second voltage source distinct from the first voltage source; and a second electrically-controlled switch defining a first connection coupled to the second voltage output, a second connection coupled to the upper base, and a second control input coupled to the controller. When the driver injects charge carriers at the second rate into the upper base, the controller may be configured to make the second electrically-controlled switch conductive by asserting the second control input.

The example switch assembly may further comprise a setpoint input defined by the first voltage source, the setpoint input coupled to the controller. When the driver injects charge carriers at the second rate through the upper base, the controller may be configured to lower a voltage applied to the first voltage output.

In the example switch assembly, the driver may further comprise: a controller; a first current source defining a first current output; and a first electrically-controlled switch defining a first connection coupled to the first current output, a second connection coupled to the upper base, and a first control input coupled to the controller. When the driver injects charge carriers at the first rate into the upper base, the controller is configured to make the first electrically-controlled switch conductive by asserting the first control input.

The example switch assembly may further comprise a second current source defining a second current output, the second current source distinct from the first current source; and a second electrically-controlled switch defining a first connection coupled to the second current output, a second connection coupled to the upper base, and a second control input coupled to the controller. When the driver injects charge carriers at the second rate into the upper base, the controller may be configured to make the second electrically-controlled switch conductive by asserting the second control input.

The example switch assembly may further comprise a setpoint input defined by the first current source, the setpoint input coupled to the controller. When the driver injects charge carriers at the second rate through the upper base, the controller may be configured to lower a current applied to the first current output.

The example switch assembly may further comprise: a controller; a means for generating charge carriers; a first electrically-controlled switch defining a first connection coupled to the means for generating charge carriers, a second connection coupled to the upper base, and a first control input coupled to the controller; and a second electrically-controlled switch defining a first connection coupled to the lower collector-emitter, a second connection coupled to the lower base, and a second control input coupled to the controller. When the driver makes the transistor non-conductive, the controller may be configure to: make the first electrically-controlled switch conductive by asserting the first control input to extract charge carriers through the upper base; and then make the first electrically-controlled switch non-conductive by de-asserting first control input; and make the second electrically-controlled switch conductive by asserting the second control input.

In the example switch assembly, when the driver makes the transistor non-conductive, the driver may be configured to directly couple the lower base of the transistor to the lower collector-emitter of the transistor, and extract charge carriers from the upper base. When the driver makes the transistor non-conductive, the driver may be further configured to, after extraction of charge carrier from the upper base, electrically float the upper base.

In the example switch assembly, the driver may be further configured to, prior to injecting charger carriers at the first rate, injecting charge carriers into the upper base at a third rate higher than the first rate, the injecting charge carriers at the third rate to decrease switching time from an off-mode to a conductive state of the transistor.

BRIEF DESCRIPTION OF THE DRAWINGS

For a detailed description of example embodiments, reference will now be made to the accompanying drawings in which.

DEFINITIONS

Figure 1:
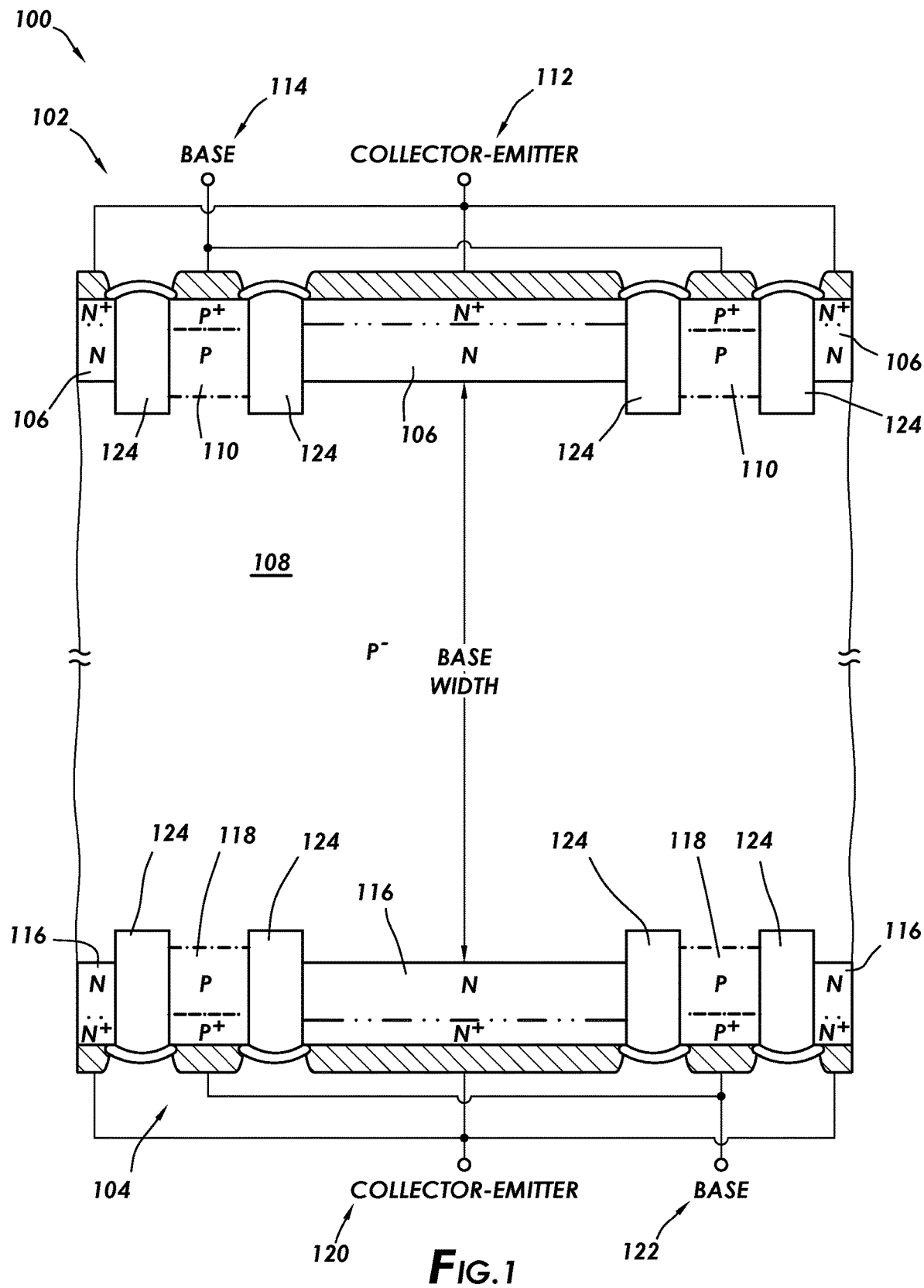
FIG. 1 shows a cross-sectional elevation view of a B-TRAN in accordance with at least some embodiments.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct connection. Thus, if a first device couples to a second device, that connection may be through a direct connection or through an indirect connection via other devices and connections.

"About" in reference to a recited parameter shall mean the recited parameter plus or minus ten percent (+1-10%) of the recited parameter.

"Assert" shall mean changing the state of a Boolean signal. Boolean signals may be asserted high or with a higher voltage, and Boolean signals may be asserted low or with a lower voltage, at the discretion of the circuit designer. Similarly, "de-assert" shall mean changing the state of the Boolean signal to a voltage level opposite the asserted state.

"Bi-directional double-base bipolar junction transistor" shall mean a junction transistor having a base and a collector-emitter on a first face or first side of a bulk region, and having a base and a collector-emitter on a second face or second side of the bulk region. The base and the collector-emitter on the first side are distinct from the base and the collector-emitter on the second side. An outward pointing vector normal to the first side points an opposite direction to an outward pointing vector normal to the second side.

"Upper base" shall mean a base of a bi-directional double-base bipolar junction transistor on a first side of a bulk region of the transistor, and shall not be read to imply a location of the base with respect to gravity.

"Lower base" shall mean a base of a bi-directional double-base bipolar junction transistor on a second side of a bulk region of the transistor opposite a first side, and shall not be read to imply a location of the base with respect to gravity.

"Upper collector-emitter" shall mean a collector-emitter of a bi-directional double-base bipolar junction transistor on a first side of a bulk region of the transistor, and shall not be read to imply a location of the base with respect to gravity.

"Lower collector-emitter" shall mean a collector-emitter of a bi-directional double-base bipolar junction transistor on a second side of a bulk region of the transistor opposite a first side, and shall not be read to imply a location of the base with respect to gravity.

"Injecting charge carries into a base" (e.g., upper base, lower base) of a transistor shall not include directly coupling (e.g., through a transistor) the base to a collector-emitter on the same side of the transistor.

"Extracting charge carries from a base" (e.g., upper base, lower base) of a transistor shall not include directly coupling (e.g., through a transistor) the base to a collector-emitter on the same side of the transistor.

The terms "input" and "output" when used as nouns refer to connections (e.g., electrical, software), and shall not be read as verbs requiring action. For example, a timer circuit may define a clock output. The example timer circuit may create or drive a clock signal on the clock output. In systems implemented directly in hardware (e.g., on a semiconductor substrate), these "inputs" and "outputs" define electrical connections. In systems implemented in software, these "inputs" and "outputs" define parameters read by or written by, respectively, the instructions implementing the function.

"Controller" shall mean, alone or in combination, individual circuit components, an application specific integrated circuit (ASIC), a microcontroller with controlling software, a reduced-instruction-set computing (RISC), a digital signal processor (DSP), process with controlling software, a processor with controlling software, a programmable logic device (PLD), or a field programmable gate array (FPGA), configured to read inputs and drive outputs responsive to the inputs.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Various examples are directed to methods and systems of operating a bi-directional double-base bipolar junction transistor (B-TRAN). In particular, various examples are directed to controlling forward voltage drop across the collector-emitters of a B-TRAN such that for a majority of the conduction period the forward voltage drop is low (e.g., 0.1V to 0.2V, inclusive), and within a predetermined period of time prior to the end of the conduction period the forward voltage drop is raised (e.g., to between 0.4V and 1.0V, inclusive). Stated in terms of conductivity, various examples are directed to controlling conductivity through the collector-emitters of the B-TRAN such that for a majority of the conduction period the conductivity is high, and within a predetermined period of time prior to the end of the conduction period the conductivity is lowered. Increasing the forward voltage drop near the end of the conduction period slightly increases conduction loss across the B-TRAN; however, increasing the forward voltage drop near the end of the conduction period decrease switching time and thus switching losses in transitioning the B-TRAN to a non-conductive state. The net effect is better overall efficiency of operation of the B-TRAN. The specification first turns to an example B-TRAN device to orient the reader.

FIG. 1 shows a cross-sectional elevation view of a B-TRAN in accordance with at least some embodiments. In particular, FIG. 1 shows a B-TRAN 100 having an upper face or upper side 102 and a lower face or lower side 104. The designations "upper" and "lower" are arbitrary and used merely for convenience of the discussion. The upper side 102 faces a direction opposite the lower side 104. Stated differently, an outward pointing vector normal to the upper side 102 (the vector not specifically shown) would point an opposite direction with respect to an outward pointing vector normal to the lower side 104 (the vector not specifically shown).

The upper side 102 includes collector-emitter contact regions 106 which form a junction with the drift region or bulk substrate 108. The upper side 102 further defines base contact regions 110 disposed between the collector-emitter contact regions 106. The collector-emitter contact regions 106 are coupled together to form an upper collector-emitter 112. The base contact regions 110 are coupled together to form an upper base 114. Similarly, the lower side 104 includes collector-emitter contact regions 116 which form a junction with the bulk substrate 108. The lower side 104 further defines base contact regions 118 disposed between the lower collector-emitter contact regions 116. The collector-emitter contact regions 116 are coupled together to form a lower collector-emitter 120. The lower base contact regions 118 are coupled together to form a lower base 122.

The example B-TRAN 100 is an NPN structure, so the collector-emitter contact regions 106 and 116 are N-type, and the base contact regions 110 and 118 are P-type. In the example system, a shallow N+ region provides ohmic contact from collector-emitter contact regions 106 and 116 to the respective collector-emitters 112 and 120. Further in the example system, shallow P+ contact doping provides ohmic contact from base contact regions 110 and 118 to the respective bases 114 and 122. In this example, dielectric-filled trenches 124 provide lateral separation between base contact regions and collector-emitter contact regions. Note that PNP-type B-TRAN devices are also contemplated; however, so as not to unduly lengthen the discussion a PNP-type B-TRAN device is not specifically shown.

In example cases, the various structures and doping associated with the upper side 102 are meant to be mirror images of the various structures and doping associated with the lower side 104. However, in some cases the various structures and doping associated with the upper side 102 are constructed at different times than the various structures and doping on the lower side 104, and thus there may be slight differences in the structures and doping as between the two sides, the differences attributable to manufacturing tolerances, but such does not adversely affect the operation of the device as a bi-directional double-base bipolar junction transistor. In order to describe operation of the example B-TRAN device, the specification now turns to an example model of the B-TRAN device, along with a simplified driver circuits.

Figure 2:
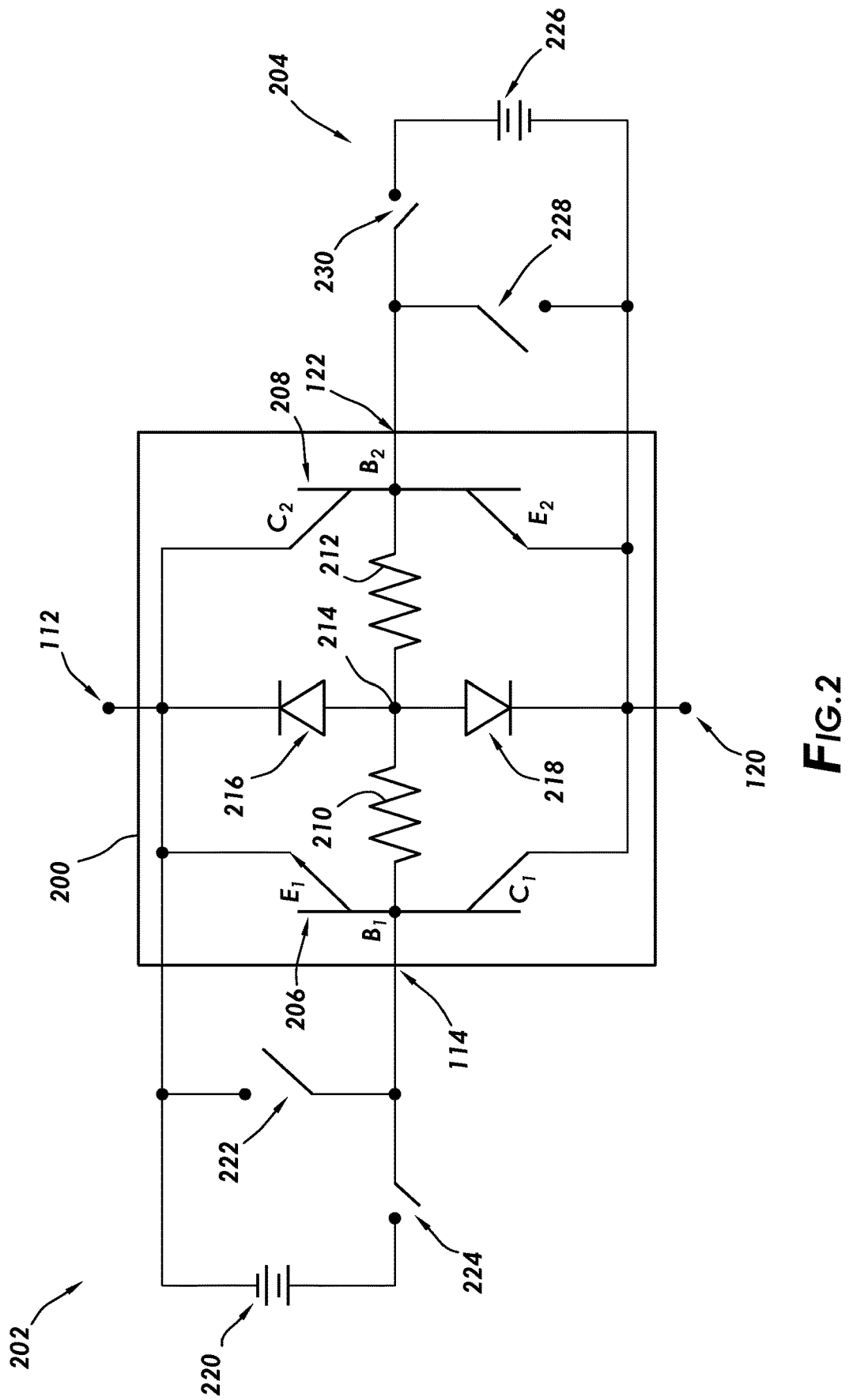
FIG. 2 shows an electrical schematic of an example model of a B-TRAN along with conceptual driver circuits, in accordance with at least some embodiments.

FIG. 2 shows an electrical schematic of an example model of a B-TRAN, along with an electrical schematic of conceptual driver circuits. In particular, FIG. 2 shows a model 200 of a B-TRAN, along with a driver portion 202 for the upper side of the B-TRAN and a driver portion 204 for the lower side of the B-TRAN. Turning first to the model 200, the example model 200 defines the upper collector-emitter 112 and the upper base 114 (though in FIG. 2 the upper base 114 is shown on the left side). The driver portion 202 couples to the upper collector-emitter 112 and upper base 114. The example model 200 further defines the lower collector-emitter 120 and the lower base 122 (though in FIG. 2 the lower base 122 is shown on the right side). The driver 204 couples to the lower collector-emitter 120 and lower base 122.

Internally, the example model 200 comprises a first NPN transistor 206 having an emitter E1 coupled to the upper collector-emitter 112, a collector C1 coupled to the lower collector-emitter 120, and a base B1 defining the upper base 114. The example model 200 further includes a second NPN transistor 208 having an emitter E2 coupled to the lower collector-emitter 120, a collector C2 coupled to the upper collector-emitter 112, and a base B2 defining the lower base 122. The bases B1 and B2 are coupled together by series resistors 210 and 212 (representing the drift region of the bulk substrate), the series resistors 210 and 212 defining a node 214 between them. A diode 216 is coupled between the node 214 and the upper collector-emitter 112, and the diode 216 represents the upper PN junction between the upper base 114 and the upper collector-emitter 112. Similarly, a diode 218 is coupled between the node 214 and the lower collector-emitter 120, and the diode 218 represents the lower PN junction between the lower base 122 and the lower collector-emitter 120.

External to the model 200, an electrically-controlled switch 222 (hereafter just switch 222) has a first lead coupled to the upper collector-emitter 112 and a second lead coupled to the upper base 114. The example switch 222 is shown as a single-pole, single-throw switch in the open or non-conductive configuration, but in practice the switch 222 may be a field effect transistor (FET). Thus, when the switch 222 is conductive, the upper base 114 is coupled to the upper collector-emitter 112. The example driver 202 further comprises a source of charge carriers 220 illustratively shown as a battery. The source of charge carriers 220 has a negative lead coupled to the upper collector-emitter 112. Another electrically-controlled switch 224 (hereafter just switch 224) has a first lead coupled to the positive terminal of the source of charge carriers 220, and a second lead coupled to the upper base 114. The example switch 224 is shown as a single-pole, single-throw switch, but in practice the switch 224 may be a FET. Thus, when the switch 224 is conductive, the source of charge carriers 220 is coupled between the upper collector-emitter 112 and the upper base 114.

Still referring to FIG. 2, an electrically-controlled switch 228 (hereafter just switch 228) has a first lead coupled to the lower collector-emitter 120 and a second lead coupled to the lower base 122. The example switch 228 is shown as a single-pole, single-throw switch, but in practice the switch 228 may be a FET. Thus, when the switch 228 is conductive, the lower base 122 is coupled to the lower collector-emitter 120. The example driver 204 further comprises another source of charge carriers 226 illustratively shown as a battery. The source of charge carriers 226 has a negative lead coupled to the lower collector-emitter 120. An electrically-controlled switch 230 (hereafter just switch 230) has a first lead coupled to the positive terminal of the battery 226, and a second lead coupled to the lower base 122. The example switch 230 is shown as a single-pole, single-throw switch, but in practice the switch 230 may be a FET. Thus, when the switch 230 is conductive, the source of charge carriers 226 is coupled between the lower collector-emitter 120 and the lower base 122.

Figure 3A:
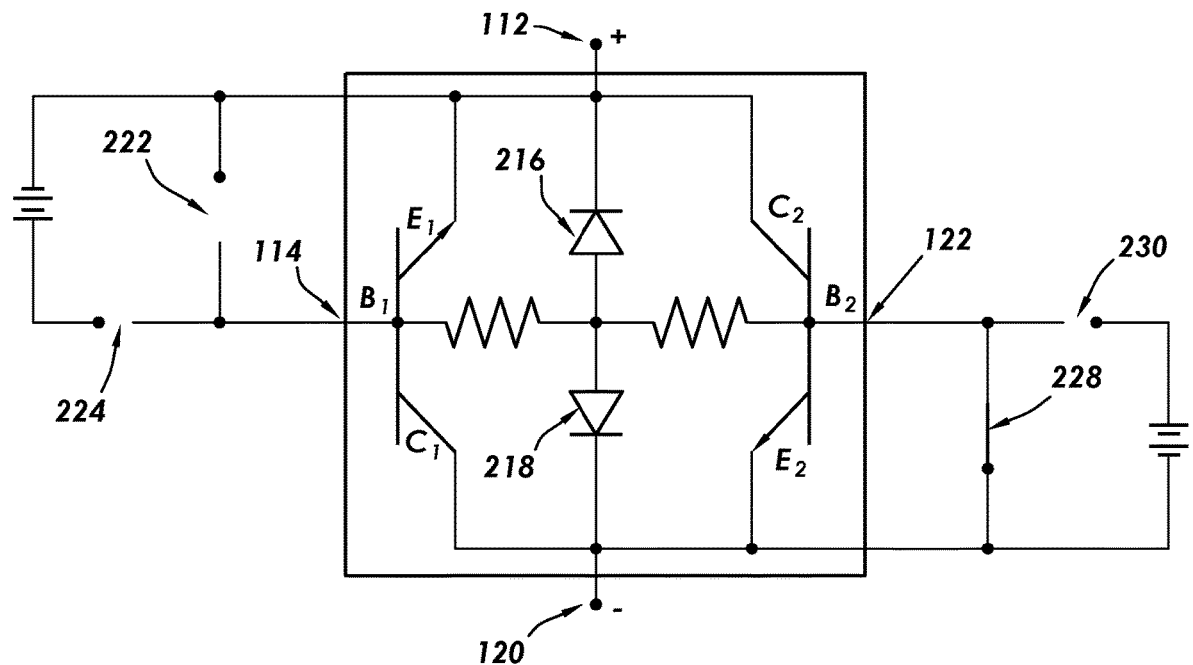
FIG. 3A shows the example model and driver circuits in which the B-TRAN is non-conductive, in accordance with example embodiments.

FIG. 3A shows the example model and driver portion circuits in a mode in which the B-TRAN is non-conductive. The switches that are non-conductive are shown as open circuits, and the switches that are conductive are shown as electrical shorts. In particular, an external voltage is applied across the upper collector-emitter 112 and lower collector-emitter 120 with the positive polarity on the upper collector-emitter 112. In the configuration shown in FIG. 3A, the switch 228 is conductive and all the remaining switches are non-conductive. Switch 228 being conductive directly couples the lower collector-emitter 120 the lower base 122, which effectively bypasses or shorts the lower PN junction illustrated by diode 218 and ensures the upper PN junction illustrated by diode 216 is reverse biased. Moreover, the upper base 114 is electrically floated. Thus, no current flows through the B-TRAN and overall the B-TRAN is non-conductive for the applied polarity. The arrangement of FIG. 3A may therefore be referred to as the off mode.

Figure 3B:
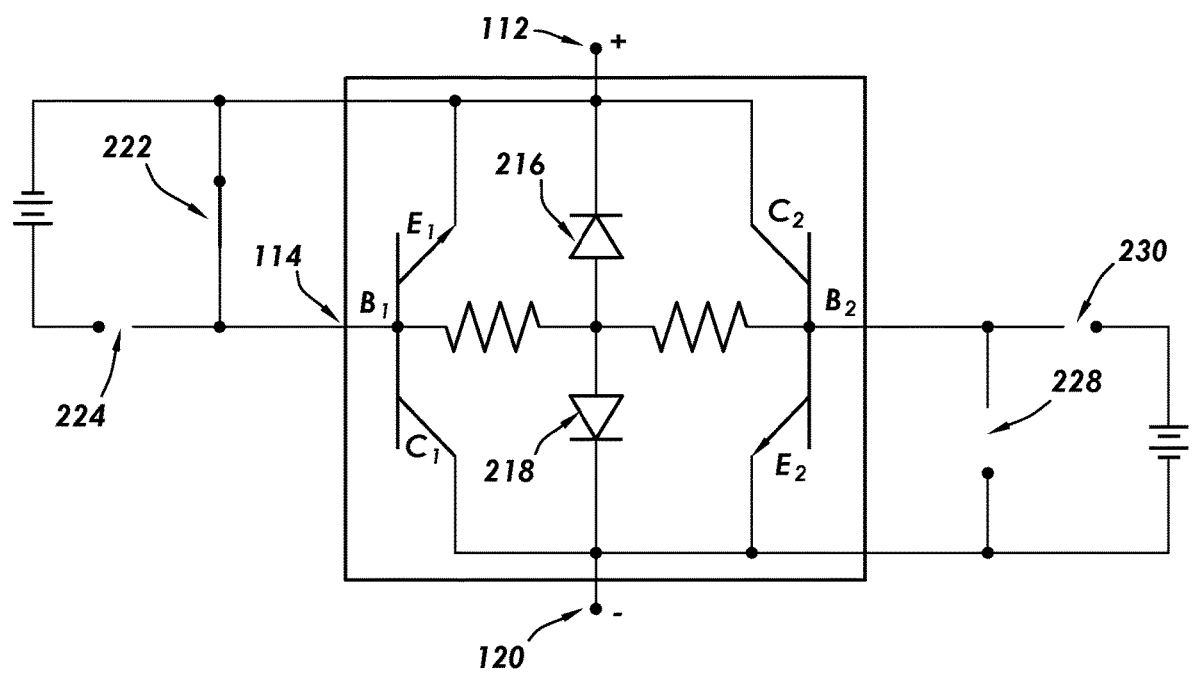
FIG. 3B shows the example model and driver circuits arranged for diode conduction, in accordance with at least some embodiments.

Now consider that the B-TRAN is to be made conductive. FIG. 3B shows the example model and driver portion circuits arranged for an optional diode conduction mode. In particular, in order to initially make the B-TRAN conductive with the external voltage in the polarity as shown, switch 222 is made conductive and switch 228 is made non-conductive. Switches 224 and 230 remain non-conductive. In the configuration shown, the upper PN junction illustrated by diode 216 is bypassed, and the lower PN junction illustrated by diode 218 is forward biased. Thus, current flows from the upper collector-emitter 112 and upper base 114 to the lower collector-emitter 120 in what is termed the diode-on mode. When used, the diode-on mode may last predetermined period of time (e.g., about 1 µs to 5 µs, inclusive). In the configuration shown, the forward voltage drop is relatively low. In one example, the forward voltage drop is about 1.0V at a current density of about 200 A/cm2. However, the forward voltage drop can be driven lower.

Figure 3C:
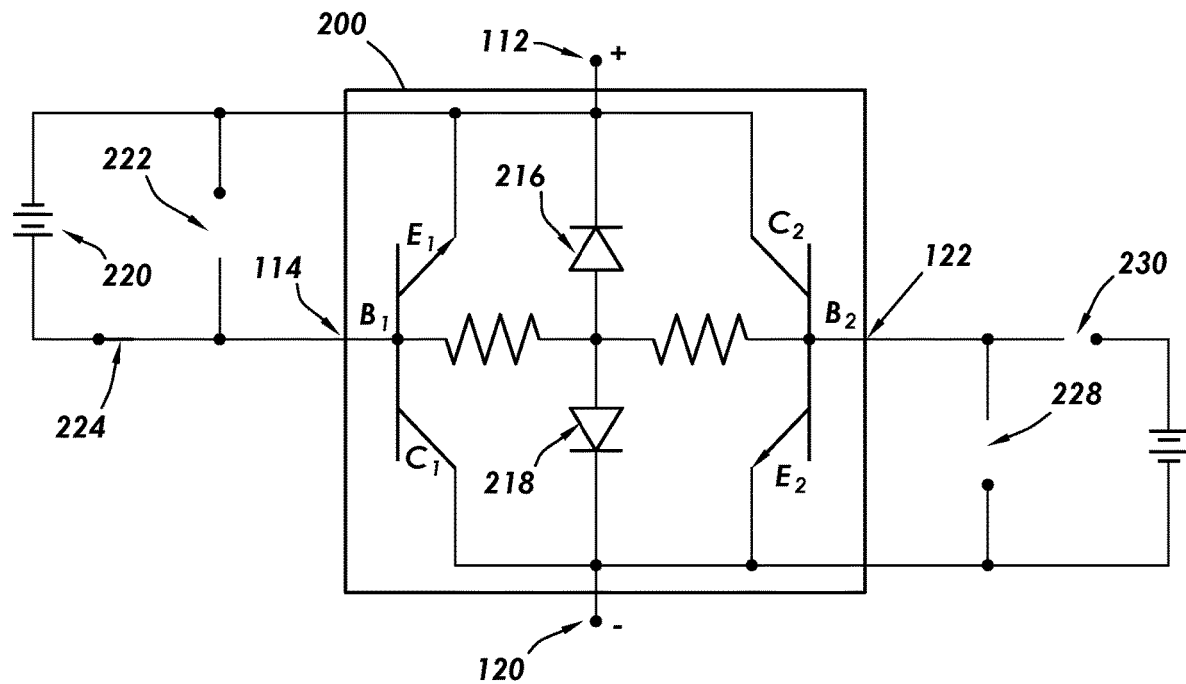
FIG. 3C shows the example model and driver circuit arranged for conduction, in accordance with at least some embodiments.

FIG. 3C shows the example model and driver circuit arranged for conduction. In cases where the diode-on mode is used, in order to further lower the forward voltage drop across the B-TRAN, switch 222 is made non-conductive, switch 224 is made conductive, and switches 228 and 230 remain non-conductive. In cases where the diode-on mode is omitted, from the off mode (FIG. 3A) switch 228 is made non-conductive, switch 224 is made conductive, and switches 222 and 230 remain non-conductive. In the configuration shown, the source of charge carriers 220 is coupled between the upper collector-emitter 112 and the upper base 114. The result is that the voltage on the upper base 114 is driven higher than the voltage on the upper collector-emitter 112. Though the lower base 122 is not externally connected and is electrically floated, the lower base 122 is internally connected through the drift region of the B-TRAN, and thus the lower base 122 may be (depending on the example voltage of the source of charge carriers 220) driven higher than the voltage on the upper collector-emitter 112. Thus, both of the example transistors of the model 200 are partially or fully conductive, and the arrangement is termed the transistor-on mode. Moreover, charge carriers (here holes) are injected into the upper base 114. The combination of the additional holes in the drift region increases the conductivity of the drift region which lowers the forward voltage drop across the B-TRAN device. In one example, with an applied voltage of about 0.7V to about 1.0V, inclusive, across the upper collector-emitter 112 and upper base 114 (e.g., by source of charge carriers 220) the forward voltage drop may be reduced to between about 0.1V and 0.2V, inclusive. The discussion now turns to making the B-TRAN non-conductive.

Figure 3D:
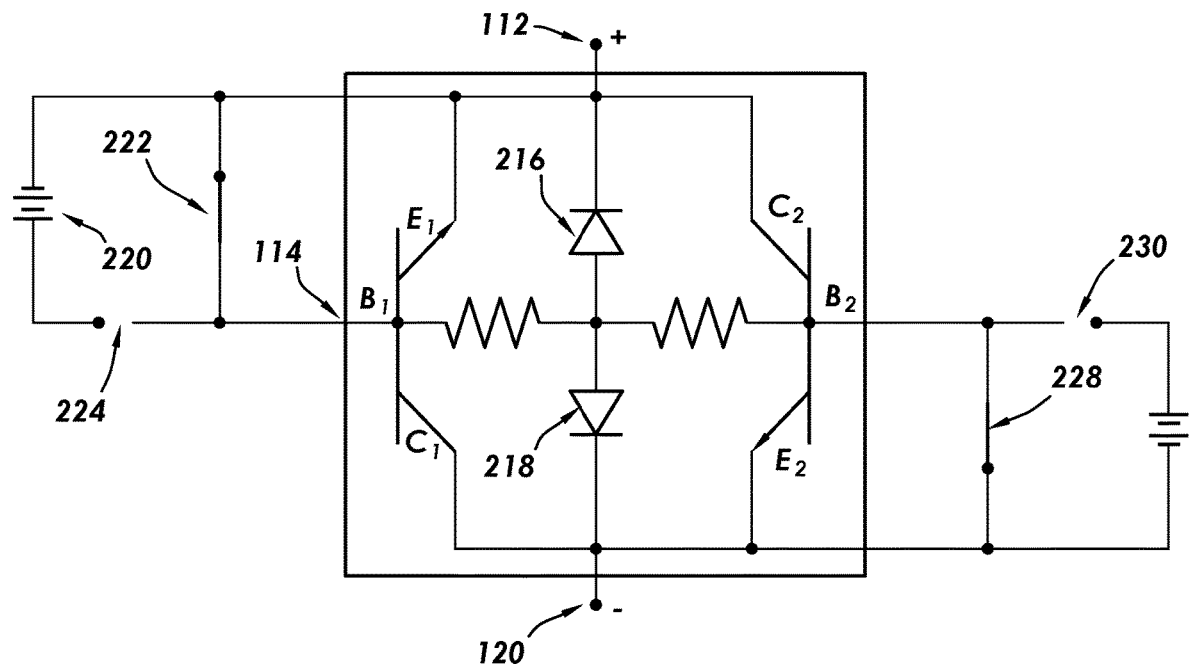
FIG. 3D shows the example model and driver circuit arranged for pre-turn off, in accordance with at least some embodiments.

FIG. 3D shows the example model and driver circuit arranged for an optional pre-turn-off mode. In particular, in some examples beginning the process of making the B-TRAN non-conductive (e.g., about 0.1 µs to 5 µs before full turn-off for a 1200V device), the switches 222 and 228 are made conductive, and switch 224 is made non-conductive. Switch 230 remains non-conductive. Making switch 224 non-conductive and making switch 222 conductive stops the injection of charge carriers into the drift region from the source of charge carriers 220. Moreover, making switch 228 conductive causes a large current drain or flow out of the drift region. It follows these actions remove charge carriers from the drift region, take the B-TRAN out of saturation, and increase forward voltage drop. Thus, the configuration is referred as the pre-turn-off mode. In one example, in the pre-turn-off mode the forward voltage drop may rise to between about 0.9V and 3V, inclusive. The example B-TRAN shown in FIGS. 3A-3D may then be made fully non-conductive, for the example polarity of the external voltage, by re-implementing the arrangement of FIG. 3A. In yet still other cases, particularly when the B-TRAN conduction is ended abruptly (e.g., circuit-breaker service), the pre-turn-off mode may be omitted, and the driver circuit portions may transition the B-TRAN directly from the transistor-on mode (FIG. 3C) to the off mode (FIG. 3A).

The examples with respect to FIGS. 3A-3D are for the situation of the external voltage having its positive voltage applied at to the upper collector-emitter 112. However, the example B-TRAN is a symmetrical device, and now understanding how to control current flow through the B-TRAN in the example polarity, control of current flow in the opposite direction directly follows. In such a situation with current flow in the opposite direction, source of charge carriers 226 and switch 230 would be used to the exclusion of source of charge carriers 220 and switch 224.

Figure 4:
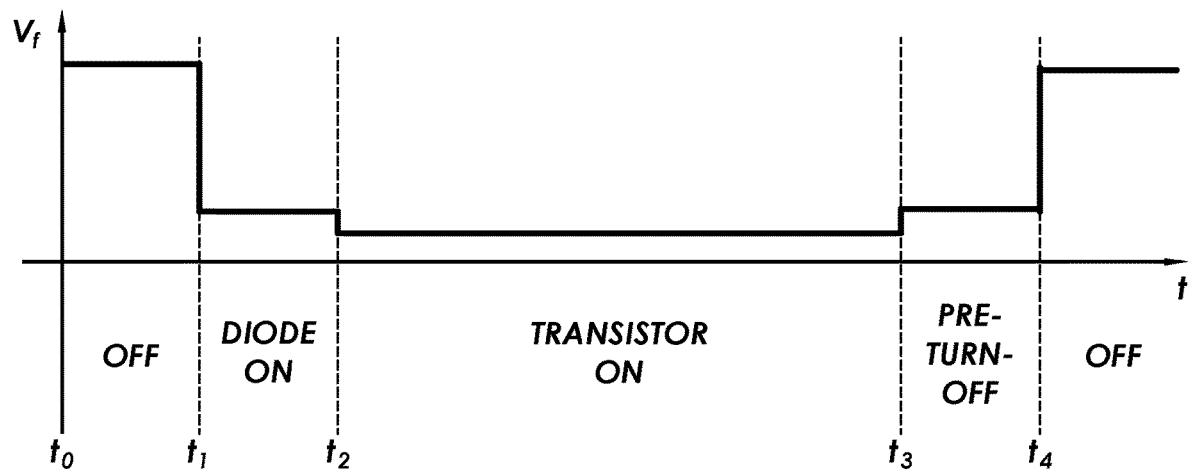
FIG. 4 shows a plot of voltage drop across a B-TRAN device as a function of time.

FIG. 4 shows a plot of voltage drop across a B-TRAN as a function of time. In particular, FIG. 4 shows the forward voltage drop (Vf) across an example B-TRAN over a single conduction period, and with the various modes discussed with respect FIGS. 3A-3D labeled. Between example time t0 and t1, the B-TRAN may be fully non-conductive and thus off. The voltage across the B-TRAN during the off time or off mode may thus be the applied voltage across the collector-emitters (e.g., 1200V). Between example time t1 and t2, the B-TRAN device may be placed in the optional diode-on mode, as discussed with respect to FIG. 3B. During the optional diode-on mode, the forward voltage drop across the B-TRAN may be about 1.0V. Between example time t2 and t3, the B-TRAN device may be placed in the transistor-on mode, as discussed with respect to FIG. 3C. During the transistor-on mode, the forward voltage drop across the B-TRAN device may be about 0.2V to 0.3V, inclusive, based on the voltage applied between the collector-emitter acting as the collector, and the base on the same side of the B-TRAN. Between example time t3 and t4, the B-TRAN device may be placed in the optional pre-turn-off mode, as discussed with respect to FIG. 3D. During the optional pre-turn-off mode, the forward voltage drop across the B-TRAN device may rise to between 0.9V and 3.0V. Finally, after time t4 the B-TRAN device is again arranged for non-conduction, as shown in FIG. 3A.

The inventor of this specification has determined that higher overall efficiency can be achieved. That is, while increasing the voltage of a base with respect to its collector-emitter acting as a collector reduces forward voltage drop across the device, the increased voltage of the base with respect to its collector-emitter also increases an amount of time to transition the B-TRAN to the non-conductive state, and therefore also increases the switching losses. Stated another way, while injecting charge carriers into the base associated with the collector-emitter acting as a collector reduces forward voltage drop, the injection of charge carriers increases the turn-off time and associated losses.

Various examples are directed to controlling forward voltage drop across a B-TRAN such that for a majority of the conduction period the forward voltage drop is low (e.g., 0.1V to 0.2V, inclusive), and within a predetermined period of time prior to the end of the conduction period (e.g., about 4 µs), and before the pre-turn-off mode, the forward voltage drop is raised (e.g., to between 0.4V and 1.0V, inclusive). Stated in terms of conductivity, various examples are directed to controlling conductivity through the B-TRAN such that for a majority of the conduction period the conductivity is high, and within a predetermined period of time prior to the end of the conduction period the conductivity is lowered. Increasing the forward voltage drop near the end of the conduction period increases slightly conduction loss across the B-TRAN; however, increasing the forward voltage drop near the end of the conduction period decrease switching losses in transitioning the B-TRAN to a non-conductive state. The net effect is better overall efficiency of operation of the B-TRAN.

Figure 5:
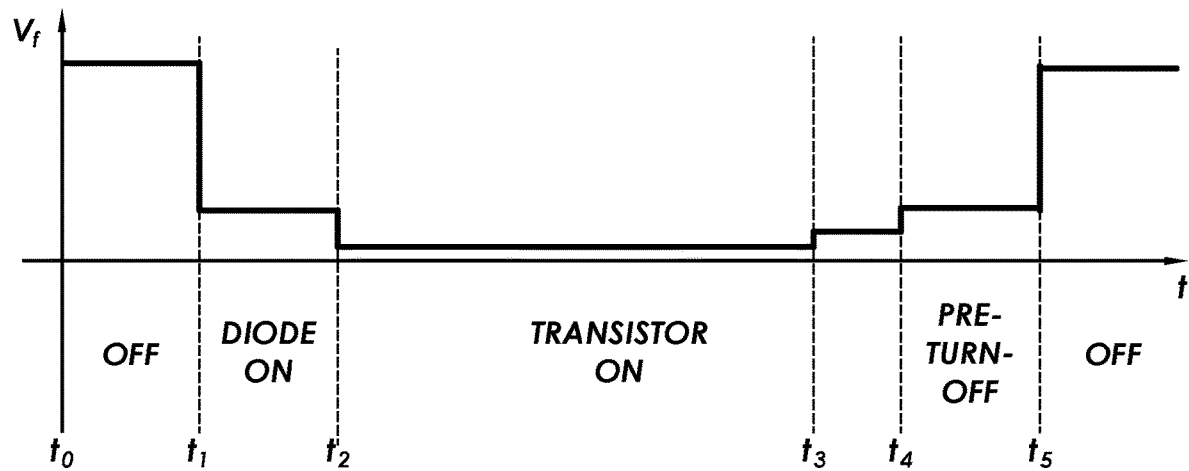
FIG. 5 shows a plot of voltage drop across a B-TRAN device as a function of time, in accordance with at least some embodiments.

FIG. 5 shows a plot of voltage drop across a B-TRAN as a function of time. In particular, FIG. 5 shows the voltage drop across an example B-TRAN over a single conduction period and using both the optional diode-on mode and the optional pre-turn-off mode. Between example time t0 and t1, the B-TRAN may be fully non-conductive and thus off. The voltage across the B-TRAN during the off mode may thus be the applied voltage (e.g., 1200V). Between example time t1 and t2, the B-TRAN device may be placed in the option diode-on mode, as discussed with respect to FIG. 3B. During the diode-on mode, the forward voltage drop across the B-TRAN may drop to about 1.0V. Between example time t2 and t3, the B-TRAN may be placed in the transistor-on mode, as discussed with respect to FIG. 3C. During the transistor-on mode, the forward voltage drop across the B-TRAN may drop to about 0.2V based on the voltage applied between the collector-emitter acting as the collector, and the base on the same side of the B-TRAN. However, unlike the situation of FIG. 4, before transitioning to the optional pre-turn-off mode or directly to the off mode, in example methods and systems the B-TRAN is placed in a transistor conduction mode where the forward voltage drop resides between the forward voltage drop associated with the saturation of the device and the forward voltage drop associated with the diode-on mode. Thus, the between example times t3 and t4, the B-TRAN is still in the transistor-on mode, but the saturation state is reduced such that the forward voltage is increased (e.g., to between 0.2V and 1.0V, inclusive, and in many cases about 0.6V). Thereafter, and between example time t4 and t5, the example B-TRAN enters the optional pre-turn-off mode, and again the forward voltage drop across the B-TRAN device may rise to between 0.9V and 3.0V. Finally, after time t5 the B-TRAN device is again arranged for non-conduction, as shown in FIG. 3A.

The time periods between t2 and t4 may be conceptually divided into two periods based on state of the driver driving the B-TRAN. Consider, as an example, an arrangement in which the upper collector-emitter has applied thereto the positive polarity of the applied voltage. Between time periods t2 and t3, the driver may be injecting charge carriers at a first rate into the upper base. The injecting of charge carriers at the first rate results in current flow through the transistor from the upper collector-emitter to the lower collector-emitter, and the current flow results in first forward voltage drop as shown between times t2 and t3. In accordance with example systems, within a predetermined period of time before the end of the conduction period (e.g., about 4 µs), the injection rate of charge carriers may change, and in example cases injecting of charge carriers into the upper base changes to a second rate lower than the first rate. The injecting of charge carriers at the second rate results in a second forward voltage drop higher than the first forward voltage drop, as shown between times t3 and t4. Thereafter, the optional pre-turn-off mode may be implemented, followed by the off mode after time t5 as shown. The specification now turns to an example switch device designed and constructed to implement the example methods.

Figure 6:
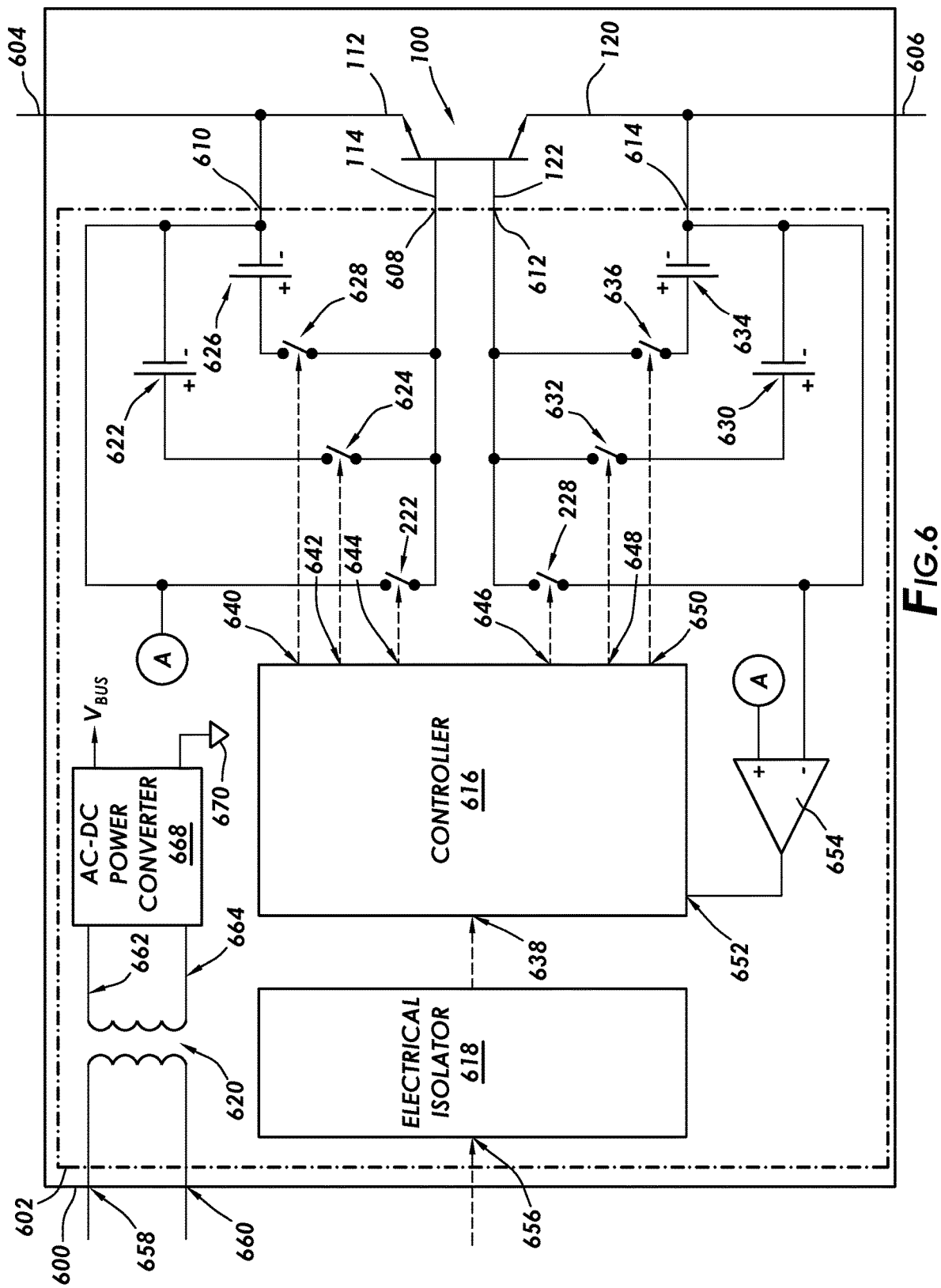
FIG. 6 shows a partial block diagram, partial electrical schematic, of a switch assembly in accordance with at least some embodiments.

FIG. 6 shows a partial block diagram, partial electrical schematic, of a switch assembly in accordance with at least some embodiments. In particular, the example switch assembly 600 comprising a B-TRAN 100 and a driver 602. The B-TRAN 100, in an NPN configuration, is shown by way of an example circuit symbol having two emitters and two bases. The circuit symbol shows the upper collector-emitter 112, the upper base 114, the lower collector-emitter 120 and the lower base 122. The upper collector-emitter 112 is coupled to an upper conduction terminal 604 of the switch assembly 600. The lower collector-emitter 120 is coupled to a lower conduction terminal 606 of the switch assembly 600. The example driver 602 defines an upper-base terminal 608 coupled to the upper base 114, an upper-conduction terminal 610 coupled to the upper collector-emitter 112, a lower-base terminal 612 coupled to the lower base 122, and a lower-conduction terminal 614 coupled to the lower collector-emitter 120.

The example driver 602 includes a controller 616, an electrical isolator 618, and an isolation transformer 620. In order to place the B-TRAN 100 in the various conduction and non-conduction states, the example driver 602 includes a plurality of electrically-controlled switches and sources of charge carriers for injection into the upper base 114 and lower base 122. In particular, the driver 602 comprises the switch 222 that has its first lead coupled to the upper collector-emitter 112, a second lead coupled to the upper base 114, and a control input coupled to the controller 616. As before, the example switch 222 is shown as a single-pole, single-throw switch, but in practice the switch 222 may be a field effect transistor (FET) with the control input being a gate of the FET. Thus, when the switch 222 is made conductive by assertion of its control input, the upper base 114 is coupled to the upper collector-emitter 112.

The driver 602 further comprises a source of charge carriers 622 illustratively shown as a battery. The source of charge carriers 622 has a negative lead coupled to the upper collector-emitter 112. Another electrically-controlled switch 624 (hereafter just switch 624) has a first lead coupled to the positive terminal of the source of charge carriers 622, a second lead coupled to the upper base 114, and a control input coupled to the controller 616. The example switch 624 is also shown as a single-pole, single-throw switch, but in practice the switch 624 may be a FET with the control input being the gate of the FET. Thus, when the switch 624 is conductive, the source of charge carriers 622 is coupled between the upper collector-emitter 112 and the upper base 114. The driver 602 further comprises another source of charge carriers 626 illustratively shown as a battery. The source of charge carriers 626 has a negative lead coupled to the upper collector-emitter 112. Another electrically-controlled switch 628 (hereafter just switch 628) has a first lead coupled to the positive terminal of the source of charge carriers 626, a second lead coupled to the upper base 114, and a control input coupled to the controller 616. The example switch 628 is also shown as a single-pole, single-throw switch, but in practice the switch 628 may be a FET with the control input being the gate of the FET. Thus, when the switch 628 is conductive, the source of charge carriers 626 is coupled between the upper collector-emitter 112 and the upper base 114.

Turning now to lower side of the B-TRAN 100, the example driver 602 further comprises the switch 228 that has a first lead coupled to the lower collector-emitter 120, a second lead coupled to the lower base 122, and a control input coupled to the controller 616. As before, the example switch 228 is shown as a single-pole, single-throw switch, but in practice the switch 228 may be a FET with the control input being a gate of the FET. Thus, when the switch 228 is made conductive by assertion of its control input, the lower base 122 is coupled to the lower collector-emitter 120. The driver 602 further comprises a source of charge carriers 630 illustratively shown as a battery. The source of charge carriers 630 has a negative lead coupled to the lower collector-emitter 120. Another electrically-controlled switch 632 (hereafter just switch 632) has a first lead coupled to the positive terminal of the source of charge carriers 630, a second lead coupled to the lower base 122, and a control input coupled to the controller 616. The example switch 632 is also shown as a single-pole, single-throw switch, but in practice the switch 632 may be a FET with the control input being the gate of the FET. Thus, when the switch 632 is conductive, the source of charge carriers 630 is coupled between the lower collector-emitter 120 and the lower base 122.

The driver 602 further comprises another source of charge carriers 634 illustratively shown as a battery. The source of charge carriers 634 has a negative lead coupled to the lower collector-emitter 120. Another electrically-controlled switch 636 (hereafter just switch 636) has a first lead coupled to the positive terminal of the source of charge carriers 634, a second lead coupled to the lower base 122, and a control input coupled to the controller 616. The example switch 636 is also shown as a single-pole, single-throw switch, but in practice the switch 636 may be a FET with the control input being the gate of the FET. Thus, when the switch 636 is conductive, the source of charge carriers 634 is coupled between the lower collector-emitter 120 and the lower base 122.

The controller 616 defines a control input 638, and control outputs 640, 642, 644, 646, 648, and 650 coupled to the control inputs of the switches 628, 624, 222, 228, 632, and 636, respectively. When the control input 638 is asserted, the controller 616 is designed and constructed to place the B-TRAN 100 into a conductive state by control of various switches. Oppositely, when the control input 638 is de-asserted, the controller 616 is designed and constructed to place the B-TRAN 100 into a non-conductive state by control of the various switches. The arrangement of the B-TRAN 100 to be in a non-conductive state is dependent upon the polarity of the applied voltage. Thus, the example controller 616 further defines a polarity input 652 that receives a Boolean indication of the applied polarity. In the example driver 602, a comparator 654 has a first input coupled to the upper conduction terminal 604 (connection shown by bubble "A") and a second input coupled to the lower conduction terminal 606. The comparator 654 defines a compare output coupled to the polarity input 652. While FIG. 6 shows the first and second inputs coupled directly to the respective conduction terminals, in practice the voltage across the B-TRAN 100 in the non-conductive state may be large (e.g., 1200V) and thus each of the first and second inputs may be coupled to their respective conduction terminals by way of respective voltage divider circuits. In yet still further cases, the applied polarity may be determined by systems and devices external to the switch assembly 600, and a Boolean signal sent across the electrical isolator 618.

As discussed above, transitioning the B-TRAN 100 from a non-conductive state, into a conductive state, and then back to a non-conductive state may be a multistep process. Thus, in some example cases the controller 616 may be individual circuit components, an application specific integrated circuit (ASIC), a microcontroller with controlling software, a reduced-instruction-set computing (RISC), a digital signal processor (DSP), process with controlling software, a processor with controlling software, a programmable logic device (PLD), or a field programmable gate array (FPGA), configured to read the control input 638 and polarity input 652, and drive control outputs to implement the state or mode transitions of the B-TRAN 100 as discussed, for example, with respect to FIG. 5.

In example systems, the switch assembly 600 is electrically floated. In order to receive the control input 638 in the electrical domain of the switch assembly 600, the example driver 602 implements the electrical isolator 618. The example electrical isolator 618 may take any suitable form, such as an optocoupler or a capacitive isolation device. Regardless of the precise nature of the electrical isolator 618, an external control signal (e.g., Boolean signal that, when asserted, indicates the B-TRAN 100 should be placed in the conductive state) may be coupled to a control input 656 of the electrical isolator 618. The electrical isolator 618, in turn, passes the control signal through to the electrical domain of the switch assembly 600. In the example, the external control signal is passed through to become the control input 638 of the controller 616.

Turning now to the isolation transformer 620. Various devices within the switch assembly 600 may use operational power. For example, the controller 616 may use a bus voltage and power to enable implementation of the various modes of operation of the B-TRAN. Further, the sources of charge carriers within system may in practice be implemented as individual voltage sources in the form of switching power converters, or individual current sources also implemented using switching power converters. The switching power converters implementing the sources of charge carriers may use bus voltage and power. In order to provide operational power within the electrical domain of the switch assembly 600, the isolation transformer 620 is provided. External systems (not specifically shown) may provide an alternating current (AC) signal across the primary leads 658 and 660 of the isolation transformer 620 (e.g., 15V AC). The isolation transformer 620 creates an AC voltage on the secondary leads 662 and 664. The AC voltage on the secondary of the isolation transformer 620 may be provided to an AC-DC power converter 668, which rectifies the AC voltage and provides power by way of bus voltage VBUS (e.g., 3.3V, 5V, 12V) with respect to a common 670. The power provided by the AC-DC power converter 668 may be used by the various components of the switch assembly 600. In other cases, multiple isolation transformer may be present (e.g., one for each side of the B-TRAN). Further still, a single isolation transformer with multiple secondary windings may be used.

Consider, as an example, a situation in which an applied voltage across the conduction terminals 604 and 606 has a positive polarity on the upper conduction terminal 604. Further consider that a control signal applied to the control input 656 of the electrical isolator 618 is de-asserted, and thus a control signal applied to the control input 638 of the controller 616 is de-asserted. Based on the de-asserted state of the control input 638, the controller 616 is designed and constructed to place the B-TRAN 100 in a non-conductive state taking into account the applied polarity (as read by the controller 616 through the polarity input 652). Thus, in the example arrangement the controller 616 may be designed and constructed to assert the control output 646 to make switch 228 conductive, and all the other control outputs are de-asserted such that all other switches are non-conductive, which electrically floats the upper base 114.

Still in the example arrangement of the positive polarity at the upper conduction terminal 604, now consider that the control signal applied to the control input 656 of the electrical isolator 618 is asserted, and thus the control signal applied to the control input 638 of the controller 616 is asserted. Based on the assertion, in the example switch assembly 600 of FIG. 6 the controller 616 may be designed and constructed to first place the B-TRAN 100 into the optional diode-on mode by de-asserting the control output 646 (thus making switch 228 non-conductive) and asserting control output 644 (thus making the switch 222 conductive). Making the switch 222 conductive couples the upper collector-emitter 112 to the upper base 114. The arrangement results in a current flow through the B-TRAN 100 and forward voltage drop commensurate the diode-on mode. When used, the diode-on mode may last a predetermined period (e.g., from about 0.1 µs to 5 µs). The controller 616 may be designed and constructed to then place the B-TRAN into the transistor-on mode by injecting charge carriers at a first rate into the upper base 114. In the transition from the diode-on mode, the controller 616 may be designed and constructed to de-assert the control output 644 (making the switch 222 non-conductive) and after a sufficient amount of time to ensure the switch 222 is non-conductive, assert the control output 642 (making switch 624 conductive). In the absence of the diode on mode, the controller 616 may be designed and constructed to de-assert the control output 646 (thus making switch 228 non-conductive) and assert the control output 642 (making switch 624 conductive). Regardless, making switch 624 conductive couples the source of charge carriers 622 between the upper collector-emitter 112 and the upper base 114. In some example systems, the source of charge carriers 622 creates a controlled voltage applied across the upper collector-emitter 112 and the upper base 114 of about 1.0V, which results in current flow into the upper base 114. As discussed above, in the arrangement the current flow into the upper base 114 increases the number of charge carriers in the drift region of the B-TRAN 100, which drives the B-TRAN 100 into a saturated state.

In many cases the control signal applied to the switch assembly 600 to control the conductive state of the B-TRAN 100 is a periodic signal with a relatively stable frequency. For example, when using the switch assembly 600 in a power converter between solar panels producing direct current (DC) and AC mains, the control signal applied to the switch assembly 600 may have a fixed frequency related to the frequency of the AC mains (e.g., 50 Hz, 60 Hz) and a duty cycle that may be proportional to the amount of solar energy being collected by the solar panels. Thus, the length of each conduction period may be relatively stable for long periods of time (e.g., minutes to hours). It follows that, in many cases, the controller 616 may be able to predict when the control signal will go de-asserted, and consequently when a conduction period is likely to end. In such situations, within a predetermined period of time before the end of the present conduction period, the example controller 616 may be designed and constructed to increase the forward voltage drop, and correspondingly decrease the conductivity through the B-TRAN 100, by injecting charge carriers at the second, lower rate into the upper base 114. In the example of FIG. 6, in order to inject charge carriers at the lower rate the controller 616 may be designed and constructed to de-assert the control output 642 (making the switch 624 non-conductive) and to assert the control output 640 (making switch 628 conductive). Making switch 628 conductive couples the source of charge carriers 626 between the upper collector-emitter 112 and the upper base 114. In some example systems, the source of charge carriers 626 creates a controlled voltage applied across the upper collector-emitter 112 and the upper base 114 of about 0.5V, which results in a reduced current flow into the upper base 114 compared to the higher voltage associated with example source of charge carriers 622. The reduced current flow into the upper base 114 decreases the number of charge carriers in the drift region of the B-TRAN 100, which drives the B-TRAN 100 into a less saturated state (compared to the prior saturation). While increased forward voltage drop and decreased conductivity increases conduction loss, the increased conduction loss is more than offset by a decrease in switching losses of the B-TRAN 100 because of decreased switching time. In example cases, when the forward voltage is increased in the second portion of the transistor-on mode, the forward voltage drop may increase by between 10% and 20%, inclusive, of the lower forward voltage drop. Stated in terms of charge carrier injection, injection of the charge carriers at the second, lower rate may be decreasing the rate of chare carrier injection by 40% or more, and in one example cases reducing the rate of charge carrier injection by about 50%.

Thereafter, the example controller 616 may transition the B-TRAN 100 into the optional pre-turn-off mode. In particular, the example controller 616 may be designed and constructed to de-assert the control output 640 (making switch 628 non-conductive) and assert the control outputs 644 and 646 (making switches 222, and 228 conductive). Making switches 222 and 228 conductive directly couples the upper collector-emitter 112 to the upper base 114, and directly couples the lower collector-emitter 120 to the lower base 122, respectively. When the control signal applied to the control input 656 goes de-asserted, indicating the B-TRAN 100 should be made fully non-conductive, the example controller may place the B-TRAN 100 in the off mode, which with the example polarity is accomplished by be de-asserting the control output 646 (making switch 228 non-conductive) and leaving control output 644 asserted (leaving switch 222 conductive). In cases where the pre-turn-off mode is not used (e.g., circuit breaker operation), the controller 616 may be designed and constructed to transition the B-TRAN directly from the transistor-on mode to the off mode be de-asserting the control output 640 (making switch 628 non-conductive) and asserting control output 646 (making switch 228 conductive). Making switch 628 non-conductive electrically floats the upper base 114 and making switch 228 conductive shorts the lower collector-emitter 120 to the lower base 122.

The example operation discussed with respect to FIG. 6 was with respect to an assumed polarity applied by the external voltage. Again, however, the example B-TRAN 100 is a symmetrical device, and now understanding how to control injection of charge carriers at different rates during the transistor-on mode, control of current flow in the opposite direction directly follows with respect to sources of charge carriers 630 and 634 and their respective switches 632 and 636.

The switch assembly 600 of FIG. 6 utilizes separate and independent sources of charge carriers associated with each side for the two injection modes for charge carriers. For example, the upper side illustratively uses the source of charge carriers 622 and source of charge carriers 626, and the lower side illustratively uses the source of charge carriers 630 and 634. However, in other cases each side of the B-TRAN 100 may use a single yet variable source of charge carriers to drive charge carriers.

Figure 7:
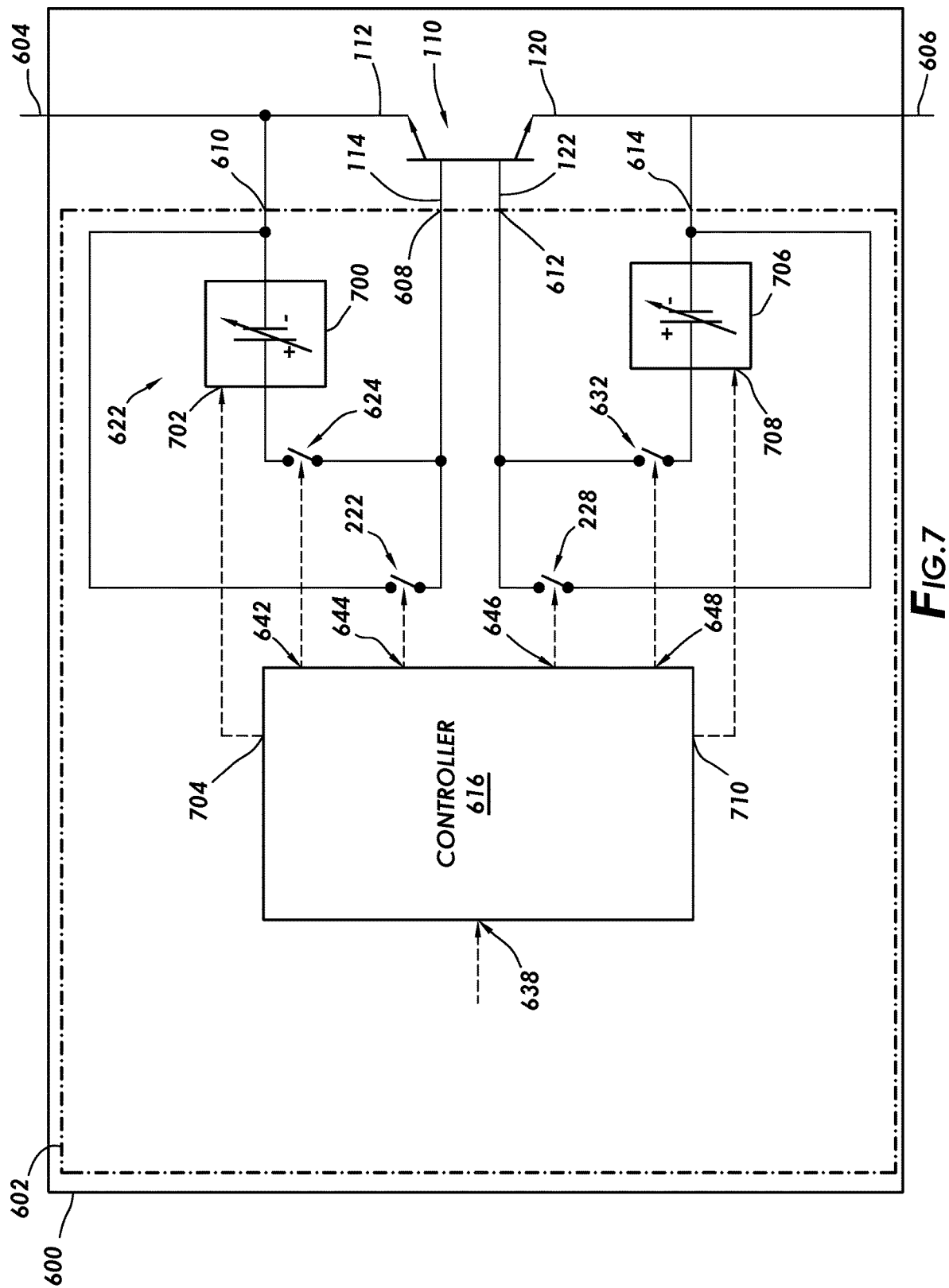
FIG. 7 shows a partial block diagram, partial electrical schematic, of a switch assembly in accordance with at least some embodiments.

FIG. 7 shows a partial block diagram, partial electrical schematic, of a switch assembly in accordance with at least some embodiments. In particular, FIG. 7 shows the example B-TRAN 100 as well as an example driver 602 comprising the controller 616. The driver 602 will likewise have the isolation transformer, the AC-DC power converter, the electrical isolator, and the comparator for polarity determinations, but those components are omitted from FIG. 7 so as not to unduly complicate the figure. The driver 602 of FIG. 7 comprises an adjustable source of charge carriers 700, illustratively shown as an adjustable voltage source in the form of a battery, associated with the upper side of the B-TRAN 100. Illustrative source of charge carriers 700 may in practice be implemented as an individual voltage source in the form of a switching power converter having a controllable or adjustable output voltage, or an individual current source also implemented using a switching power converter with a controllable or adjustable output. The source of charge carriers 700 has a negative lead coupled to the upper collector-emitter 112, a positive lead coupled to the electrically controlled switch 624, and a setpoint input 702. Thus, when switch 624 is conductive, the source of charge carriers 700 is coupled between the upper collector-emitter 112 and the upper base 114. The controller 616 in this example defines a setpoint output 704 (e.g., an analog output, or a digital output) coupled to the setpoint input 702, and thus the controller 616 is designed and constructed to control the injection rate of charge carriers produced by source of charge carriers 700 by controlling the setpoint output 704.

The driver 602 of FIG. 7 also comprises an adjustable source of charge carriers 706, illustratively shown as an adjustable voltage source in the form of a battery, associated with the lower side of the B-TRAN 100. Illustrative source of charge carriers 706 may in practice be implemented as an individual voltage source in the form of a switching power converter having a controllable or adjustable output voltage, or an individual current source also implemented using a switching power converter with a controllable or adjustable output. The source of charge carriers 706 has a negative lead coupled to the lower collector-emitter 120, a positive lead coupled to the electrically controlled switch 632, and a setpoint input 708. Thus, when switch 632 is conductive, the source of charge carriers 706 is coupled between the lower collector-emitter 120 and the lower base 122. The controller 616 in these example defines a setpoint output 710 (e.g., an analog output, or a digital output) coupled to the setpoint input 708, and thus the controller 616 is designed and constructed to control the injection rate of charge carriers produced by the source of charge carriers 706 by controlling the setpoint output 710.

Consider, as an example, a situation in which an applied voltage across the conduction terminals 604 and 606 has a positive polarity on the upper conduction terminal 604. Further consider that a control signal applied to the control input 638 is de-asserted. Based on the de-asserted state of the control input 638, the controller 616 is designed and constructed to place the B-TRAN 100 in a non-conductive state taking into account the applied polarity. Thus, in the example arrangement the controller 616 is designed and constructed to assert the control output 646 to make switch 228 conductive, and all the other control outputs are de-asserted such that all other switches are non-conductive.

Now consider that the control signal applied to control input 638 of the controller 616 is asserted, indicating the B-TRAN 100 should be made conductive. Based on the assertion, in the example switch assembly 600 of FIG. 7 the controller 616 may be designed and constructed to first place the B-TRAN 100 into the optional diode-on mode by de-asserting the control output 646 (thus making switch 228 non-conductive) and asserting control output 644 (thus making the switch 222 conductive). Making the switch 222 conductive results in a current flow through the B-TRAN 100 and forward voltage drop commensurate the diode-on mode. After a predetermine period of time, the controller 616 may be designed and constructed to transition the B-TRAN 100 into the transistor-on mode by injecting charge carriers at a first rate into the upper base 114. In the example of FIG. 7, in order to inject charge carriers at the first rate the controller 616 may be designed and constructed to de-assert the control output 644 (making the switch 222 non-conductive) and after a sufficient amount of time to ensure the switch 222 is non-conductive, assert the control output 642 (making switch 624 conductive). Moreover, in the example system the controller 616 may drive a setpoint signal to the setpoint output 704 and thus to the setpoint input 702 of the source of charge carriers 700. Driving the setpoint signal and making the switch 624 conductive injects charge carriers, at a first rate, into the upper base 114. In cases in which the optional diode-on mode is omitted, the example controller 616 may be designed and constructed to transition the B-TRAN 100 directly from the off mode to the transistor-on mode by de-asserting the control output 646 (thus making switch 228 non-conductive), asserting the control output 642 (making switch 624 conductive), and driving the setpoint signal to the setpoint output 704 and thus to the setpoint input 702 of the source of charge carriers 700. Regardless, in some example systems the source of charge carriers 700 applies a controlled voltage across the upper collector-emitter 112 and the upper base 114 of about 1.0V, which results in current flow into the upper base 114. As discussed above, the current flow into the upper base 114 increases the number of charge carriers in the drift region of the B-TRAN 100, which drives the B-TRAN 100 into a saturated state.

As before, the controller 616 predicts when the control signal applied to the control input will go de-asserted, and consequently when a conduction period is likely to end. In such situations, within a predetermined period of time before the end of the present conduction period, the example controller 616 may be designed and constructed to increase the forward voltage drop, and correspondingly decrease the conductivity through the B-TRAN 100, by injecting charge carriers at a second, lower rate into the upper base 114. In the example of FIG. 7, in order to inject charge carriers at the lower rate the controller 616 may be designed and constructed to drive a second, different setpoint signal to the setpoint output 704 and thus the setpoint input 702 of the source of charge carriers 700. In some example systems, the controlled voltage applied across the upper collector-emitter 112 and the upper base 114 is about 0.5V, which results in a decreased current flow into the upper base 114 compared to the higher voltage. The reduced current flow into the upper base 114 decreases the number of charge carriers in the drift region of the B-TRAN 100, which drives the B-TRAN 100 into a less saturated state (compared to the prior saturation). While increased forward voltage drop and decreased conductivity increase conduction loss, the increased conduction loss is more than offset by a decrease in switching losses.

The example operation discussed with respect to FIG. 7 was with respect to an assumed polarity applied by the external voltage. Again, however, the example B-TRAN 100 is a symmetrical device, and now understanding how to control injection of charge carriers at different rates during the transistor-on mode, and using a controllable source of charge carriers, control of current flow in the opposite direction directly follows.

The various examples discussed to this point increase the forward voltage drop within a predetermined period of time of the end of the conduction period such that the switching losses are decreased, and the net effect is an increase the overall efficiency of the B-TRAN. In addition to, or in place of, such techniques, further examples decrease switching time and thus decrease switching losses by actively injecting charge carriers into the drift region during state transitions from the non-conduction or off mode to a conduction mode (e.g., diode-on mode, transistor-on mode and/or the pre-turn-off mode). Moreover, other examples decrease switching time and thus decrease switching losses by actively extracting charge carriers from the drift region during state transitions from any of the conduction modes (e.g., diode-on mode, transistor-on mode, and/or pre-turn-off mode) to the non-conduction or off mode.

Figure 8:
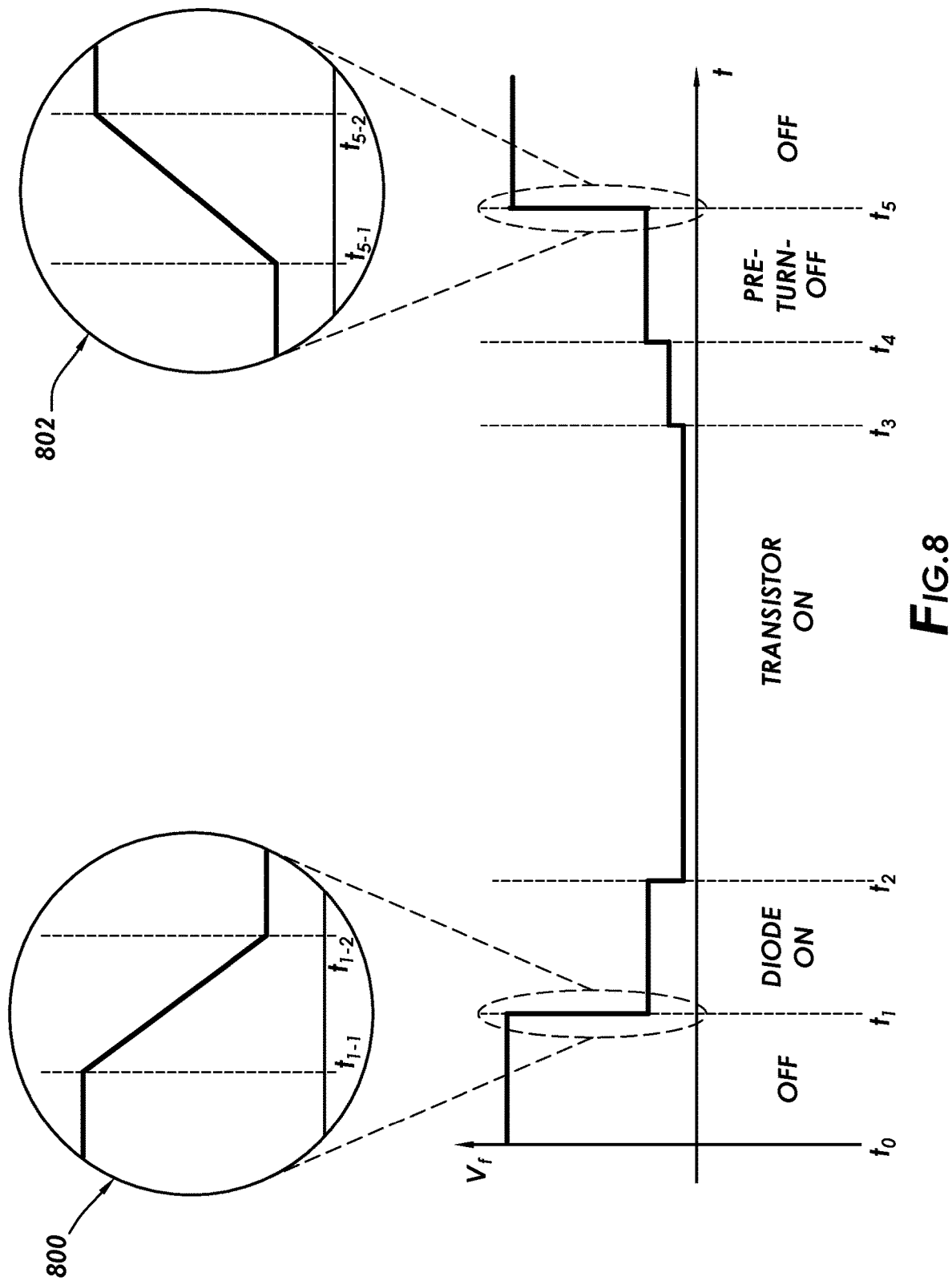
FIG. 8 shows a plot of voltage drop across a B-TRAN device as a function of time, in accordance with at least some embodiments.

FIG. 8 shows a plot of voltage drop across a B-TRAN device as a function of time. In particular, FIG. 8 shows the voltage drop across an example B-TRAN over a single conduction period and using both the optional diode-on mode and the optional pre-turn-off mode. FIG. 8 also shows, by way of a magnified section 800, the transition from off-mode to a conduction mode at time t1. FIG. 8 also shows, by way of a magnified section 802, the transition from a conduction mode to the off mode at time t5. That is, the transitions in the larger FIG. 8 are shown as ideal transitions occurring precisely at the designated times. However, in practice the transition from the off mode (e.g., prior to time t1) to a conduction mode at time t1 (e.g., to diode-on mode as shown, or to transistor-on mode) takes a finite and non-zero amount of time. Similarly, in practice the transition from a conduction mode to the off mode at time t5 (e.g., from the pre-turn-off mode as shown, or from transistor-on mode) takes a finite and non-zero amount of time.

The inventor of the present specification has found that an amount of time needed for the transitions from the off mode to a conductive mode can be reduced by injecting charge carriers into the drift region by way the c-base during the transition, and in some cases injection into both the c-base and the e-base. In some cases the injection of charge carriers during the transition is at a rate higher than the example injection charge carriers discussed above with respect to the transistor-on modes. Reducing the switching time thus reduces the switching losses, and while injecting charge carriers itself uses energy, taking into account the lower switching losses the net effect is greater overall efficiency. Similarly, the inventor of the present specification has found that an amount of time needed for the transitions from a conductive mode to the off mode can be reduced by extracting charge carriers from the drift region by way the c-base during the transition, and in some cases extracting from both the c-base and e-base. Reducing the switching time thus reduces the switching losses, and while extracting charge carriers itself uses energy, taking into account the lower switching losses the net effect is greater overall efficiency. Before proceeding it is noted that while example embodiments discussed below both inject charge carriers during the transition from the off mode, and extract charge carriers during transition to the off mode, in other cases the injection of charge carriers during transition to a conduction mode may be used to the exclusion of the extraction of charge carriers during the transition to the non-conductive or off mode, and vice versa.

Still referring to FIG. 8, the magnified region 800 shows the transition from the off mode prior to time t1 to the example diode-on mode after time t1. Again, the transition to the diode-on mode is merely illustrative, and in other cases the transition from the off mode may be directly to the transistor-on mode. In particular, in accordance with example embodiments the transition from the off mode begins by actively injecting charge carriers into the c-base at example time t1-1. Injecting charge carriers affects the slope of the forward voltage drop between time t1-1 and t1-2, with higher injection rates resulting in steeper downward slope. Stated otherwise, the rate of injection of charge carriers affects how quickly the B-TRAN transitions to the conductive mode, with higher injection rates resulting in faster switching times. At example time t1-2, in example systems the injection of charge carriers associated with the transition ceases. In cases where the optional diode-on mode is used, example systems may thus cease injection of charge carriers and transition to the diode-on mode configuration as discussed above. In cases where the optional diode-on mode is not used, example systems may thus cease injection of charge carriers at the rate associated with the transition, and begin injection charge carriers at the rate associated with the transistor-on mode, as discussed above.

Similarly with respect to transitions to the off mode, magnified region 802 shows the transition from the optional pre-turn-off mode prior to time t5 to the example to the off mode after time t5. Again, the transition from the pre-turn-off mode is merely illustrative, and in other cases the transition to the off mode may be directly from the transistor-on mode (in any of the charge carrier injection regimes discussed above). In accordance with example embodiments, the transition from the conductive mode to the off mode begins by actively extracting charge carriers from the c-base (or both the c-base and e-base) at example time t5-1. Extracting charge carriers affects the slope of the forward voltage drop between time t5-1 and t5-2, with higher extraction rates resulting in steeper upward slope. Stated otherwise, the rate of extraction of charge carriers affects how quickly the B-TRAN transitions to the off mode, with higher extraction rates resulting in faster switching times. At example time t5-2, the example B-TRAN may be in fully non-conductive. In some cases, the extraction of charge carriers associated with the transition ceases when the B-TRAN becomes fully non-conductive. However, the timing of ceasing the extraction is not critical, and the arrangement for extraction of charge carriers may extend for a non-zero amount of time into during periods when the B-TRAN is non-conductive. In one example case, the arrangement for extraction of charge carriers may extend until the next transition from the off mode to a conduction mode. Stated otherwise, the arrangement for extraction of charge carriers may be an alternative off mode for the B-TRAN.

Figure 9:
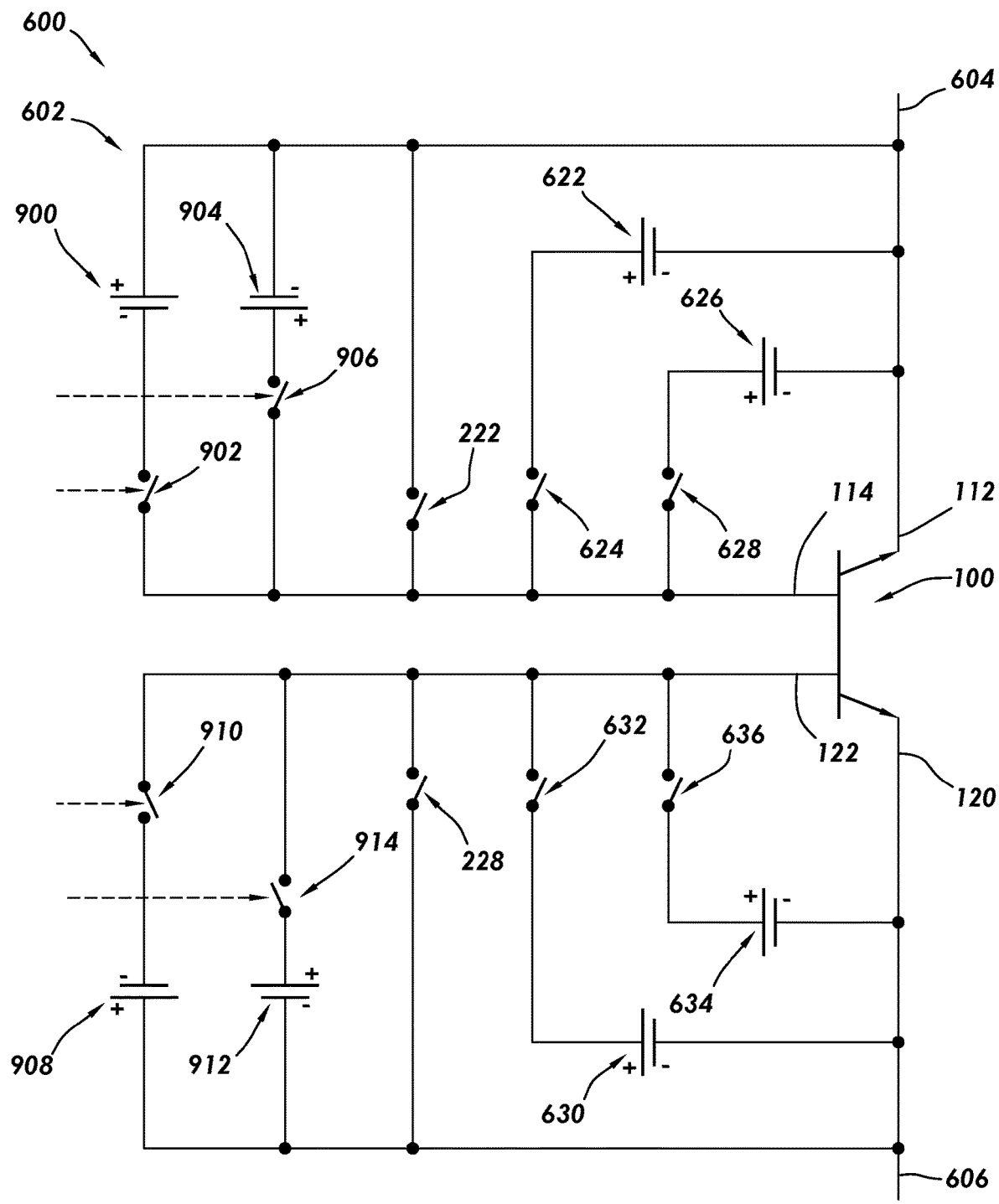
FIG. 9 shows a partial electrical schematic of a switch assembly in accordance with at least some embodiments.

FIG. 9 shows a partial electrical schematic of a switch assembly in accordance with at least some embodiments. In particular, FIG. 9 shows the example B-TRAN 100 as well as portions of an example driver 602. The driver 602 will likewise have the isolation transformer, the AC-DC power converter, the electrical isolator, the controller, and the comparator, but those components are omitted from the shorthand notation of FIG. 9. For purposes of discussion, FIG. 9 shows the switches 222, 624, 628, 228, 632, and 636, as well as the example sources of charge carriers 622, 626, 630, and 634, all as originally presented with respect to FIG. 6.

Referring initially to the upper side of the B-TRAN 100, the driver 602 of FIG. 9 further includes a source of charge carriers 900 illustratively shown as a battery. The source of charge carriers 900 has a positive lead coupled to the upper collector-emitter 112. Another electrically-controlled switch 902 (hereafter just switch 902) has a first lead coupled to the negative terminal of the source of charge carriers 900, a second lead coupled to the upper base 114, and a control input coupled to the controller 616 (not shown). The example switch 902 is shown as a single-pole, single-throw switch, but in practice the switch 902 may be a FET with the control input being the gate of the FET. Thus, when the switch 902 is conductive, the source of charge carriers 900 is coupled between the upper collector-emitter 112 and the upper base 114.

Still referring to the upper side of the B-TRAN 100, the driver 602 of FIG. 9 further includes a source of charge carriers 904 illustratively shown as a battery. The source of charge carriers 904 has a negative lead coupled to the upper collector-emitter 112. Another electrically-controlled switch 906 (hereafter just switch 906) has a first lead coupled to the positive terminal of the source of charge carriers 904, a second lead coupled to the upper base 114, and a control input coupled to the controller 616 (not shown). The example switch 906 is shown as a single-pole, single-throw switch, but in practice the switch 906 may be a FET with the control input being the gate of the FET. Thus, when the switch 906 is conductive, the source of charge carriers 904 is coupled between the upper collector-emitter 112 and the upper base 114.

Turning now the lower side of the B-TRAN 100, the example driver 602 of FIG. 9 further includes a source of charge carriers 908 illustratively shown as a battery. The source of charge carriers 908 has a positive lead coupled to the lower collector-emitter 120. Another electrically-controlled switch 910 (hereafter just switch 910) has a first lead coupled to the negative terminal of the source of charge carriers 908, a second lead coupled to the lower base 122, and a control input coupled to the controller 616 (not shown). The example switch 910 is shown as a single-pole, single-throw switch, but in practice the switch 910 may be a FET with the control input being the gate of the FET. Thus, when the switch 910 is conductive, the source of charge carriers 908 is coupled between the lower collector-emitter 120 and the lower base 122.

Still referring to the lower side of the B-TRAN 100, the example driver 602 of FIG. 9 further includes a source of charge carriers 912 illustratively shown as a battery. The source of charge carriers 912 has a negative lead coupled to the lower collector-emitter 120. Another electrically-controlled switch 914 (hereafter just switch 914) has a first lead coupled to the positive terminal of the source of charge carriers 912, a second lead coupled to the lower base 122, and a control input coupled to the controller 616 (not shown). The example switch 914 is shown as a single-pole, single-throw switch, but in practice the switch 912 may be a FET with the control input being the gate of the FET. Thus, when the switch 912 is conductive, the source of charge carriers 912 is coupled between the lower collector-emitter 120 and the lower base 122.

Consider, as an example, a situation in which an applied voltage across the conduction terminals 604 and 606 has a positive polarity on the upper conduction terminal 604. For the off mode, the optional diode-on mode, the transistor-on mode, and the optional pre-turn-off mode, operation of the example switch assembly 600 of FIG. 9 may be the same as discussed with respect to FIGS. 3A-3C and/or FIG. 6, and will not be repeated again here so as not to unduly lengthen the discussion. However, when the controller 616 (not shown) transitions the B-TRAN 100 from the non-conductive mode or off mode to a conduction mode (e.g., the diode-on mode, or directly to the transistor-on mode), the further example system of FIG. 9 may inject charge carriers into the upper base 114 by way of the switch 906 and source of charge carriers 904. In particular, when the controller 616 transitions from the off mode to a conduction state, the controller 616 may be designed and constructed to assert the control input of switch 906, making the switch 906 conductive and thus coupling the source of charge carriers 904 between the upper base 114 and the upper collector-emitter 112. The polarity of the source of charge carriers 904 injects charge carriers (here holes) into the drift region through upper base 114, which enables a faster transition to a conduction state than, for example, shorting the upper collector-emitter 112 to the upper base 114. Stated in terms of slope of the forward voltage drop, the example polarity of the source of charge carriers 904 increases the downward slope of the forward voltage drop (see, e.g., magnified region 800 of FIG. 8), which decreases switching time and thus decreases switching losses. In example cases, the source of charge carriers 904 may be a voltage source (e.g., between 5.0V and 15V, inclusive), and injecting the charge carriers may reduce the time to transition from the off mode to a conductive mode by between about 0.5 µs and 2 µs, inclusive, as compared to applying the diode-on mode or moving directly to the transistor-on mode.

Now consider a transition from a conduction mode (e.g., transistor-on mode, or pre-turn-off mode) to a non-conductive mode or off mode, again in the example situation of the positive polarity at the upper conduction terminal 604. When the controller 616 (not shown) transitions the B-TRAN 100 from a conduction mode to the non-conductive mode, the further example system of FIG. 9 may extract charge carriers through the upper base 114 by way of the switch 902 and source of charge carriers 900. In particular, when the controller 616 transitions from a conduction mode to non-conductive mode, the controller 616 may be designed and constructed to assert the control input of switch 902, making the switch 902 conductive and thus coupling the source of charge carriers 900 between the upper base 114 and the upper collector-emitter 112. The polarity of the source of charge carriers 900 extracts charge carriers from the drift region through upper base 114, which enables a faster transition to a non-conductive mode than, for example, electrically floating the upper base 114. Stated in terms of slope of the forward voltage drop, the example polarity of the source of charge carriers 900 increases the upward slope of the forward voltage drop (see, e.g., magnified region 802 of FIG. 8), which decreases switching time and thus decreases switching losses. In example cases, the source of charge carriers 900 may be a voltage source (e.g., between 5.0V and 15V, inclusive), and extracting the charge carriers may reduce the time to transition from a conductive state to the off mode by between about 0.5 µs and 2 µs, inclusive, as compared to move to an example off mode where the upper base 114 is electrically floated and the lower collector-emitter 120 is shorted to the lower base 122.

Consider a transition from a conduction mode (e.g., transistor-on mode, or pre-turn-off mode) to a non-conductive mode or off mode, again in the example situation of the positive polarity at the upper conduction terminal 604. When the controller 616 (not shown) transitions the B-TRAN 100 from a conduction mode to the non-conductive mode, the further example system of FIG. 9 may extract charge carriers through the lower base 122 by way of the switch 910 and source of charge carriers 908. In particular, when the controller 616 transitions from a conduction mode to non-conductive mode, the controller 616 may be designed and constructed to assert the control input of switch 910, making the switch 910 conductive and thus coupling the source of charge carriers 908 between the lower base 122 and the lower collector-emitter 120. The polarity of the source of charge carriers 908 extracts charge carriers from the drift region through the lower base 122, which enables a faster transition to a non-conductive mode than, for example, electrically shorting the lower collector-emitter 120 to the lower base 122. Stated in terms of slope of the forward voltage drop, the example polarity of the source of charge carriers 908 increases the upward slope of the forward voltage drop (see, e.g., magnified region 802 of FIG. 8), which decreases switching time and thus decreases switching losses. In example cases, the source of charge carriers 908 may be a voltage source (e.g., between 5.0V and 15V, inclusive), and extracting the charge carriers may reduce the time to transition from a conductive state to the off mode by between about 0.5 µs and 2 µs, inclusive, as compared to move to an example off mode where the lower collector-emitter 120 is directly coupled to the lower base 122.

Consider again a transition from a conduction mode (e.g., transistor-on mode, or pre-turn-off mode) to a non-conductive mode or off mode, again in the example situation of the positive polarity at the upper conduction terminal 604. When the controller 616 (not shown) transitions the B-TRAN 100 from a conduction mode to the non-conductive mode, the further example system of FIG. 9 may extract charge carriers through the upper base 114 and simultaneously extract charge carriers through the lower base 122, as discussed above in the individual extraction cases.

As alluded to with respect to FIG. 8, the timing of ceasing the extraction is not critical, and the arrangement for extraction of charge carriers may extend for a non-zero amount of time into the non-conductive mode. In one example case, the arrangement for extraction of charge carriers may extend until the next transition to the conductive mode. Stated otherwise, the arrangement for extraction of charge carriers may be an alternative off mode for the B-TRAN.

The example operation discussed with respect to FIG. 9 was with respect to an assumed polarity applied by the external voltage. Again, however, the example B-TRAN 100 is a symmetrical device, and now understanding how to control injection of charge carriers during transitions from the off mode to a conduction mode, and further understanding how to control extraction of charge carriers during transition from a conduction mode to the off mode, control of the B-TRAN 100 in the opposite direction directly follows.

Still referring to FIG. 9, and particularly the sources of charge carriers associated with the upper side of the B-TRAN 100, note that the polarity of the source of charge carriers 904 is the same as the polarity of the sources of charge carriers 622 and 626. FIG. 7 described an alternative arrangement in which a single, adjustable source of charge carriers 700 is associated with the upper side. Now understanding the injection of charge carriers as a mechanism to decrease switching time, it follows that the source of charge carriers 700 of FIG. 7 may likewise be used to inject charge carriers during the transition from the off mode or non-conductive mode to a conduction mode by appropriately driving the setpoint to the source of charge carriers 700. A similar discussion also follows with the respect to the source of charge carriers 914 and the adjustable source of charge carriers 706 associated with the lower side of the B-TRAN 100.

Still considering FIG. 9, and particularly the upper side of the B-TRAN 100, note that though FIG. 9 shows four separate and distinct sources of charge carriers, only one source of charge carriers is used at any one time in the examples. Thus, it follows that in alternative examples a single, adjustable source of charge carriers could be used in association with the upper side of the B-TRAN 100, along with an appropriate switching network to control the polarity of the coupling of the single, adjustable source of charge carriers to between the upper collector-emitter 112 and the upper base 114. A similar discussion is true for the lower side of the B-TRAN 100 as well. Further still, considering both the upper side and lower side simultaneously, in cases in which only one source of charge carriers is active at any one time, a single, adjustable source of charge carriers and corresponding switch network may be used to implement all the example embodiments discussed herein.

Figure 10:
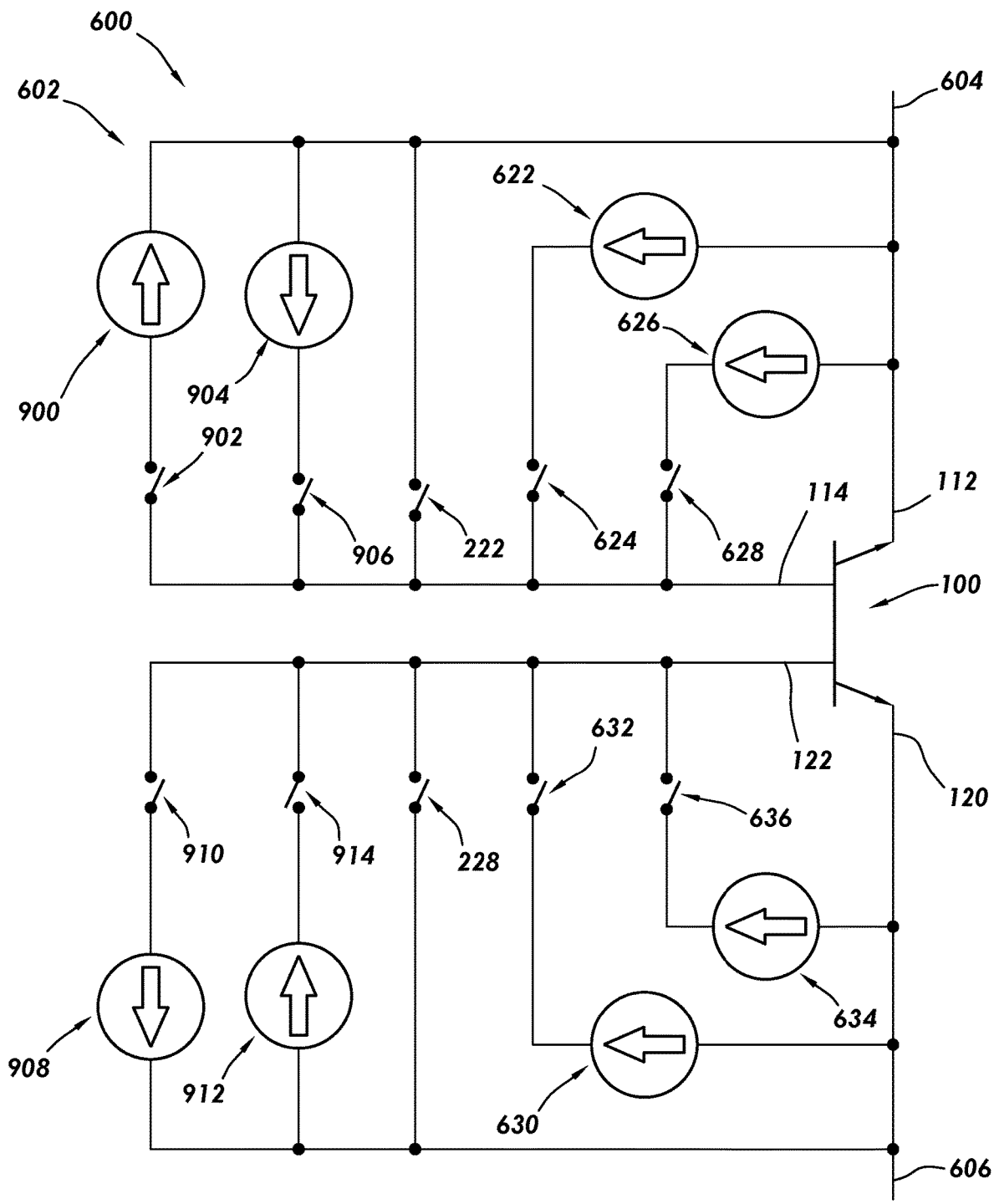
FIG. 10 shows a partial electrical schematic of a switch assembly in accordance with at least some embodiments.

FIG. 10 shows a partial electrical schematic of a switch assembly in accordance with at least some embodiments. In particular, FIG. 10 shows the example B-TRAN 100 as well as portions of an example driver 602 shown in the shorthand notation. FIG. 10 shows the switches 902, 906, 222, 624, 628, 910, 914, 228, 632, and 636. In FIG. 10, however, the example sources of charge carriers 900, 904, 622, 626, 908, 912, 630, and 634 are illustratively shown as current sources rather than voltage sources or batteries. Operation of the example embodiments of FIG. 10 are similar to FIG. 6 (without the sources of charge carriers 900, 904, 908, 912), or FIG. 9 (with the optional sources of charge carriers 900, 904, 908, 912). When using current sources as the sources of charge carriers, rather than applying and maintaining a particular voltage between a base and collector-emitter, the source of charge carriers modulates applied voltage to provide a constant current into or out of the respective base. For example, for the current sources that may be active during the transistor-on mode, the constant current setpoint may be about 20 A to 30 A (for a 100 A B-TRAN device), though if load current through the B-TRAN is reduced, the setpoint current may be reduced accordingly. For example, for a 30 A load current, the base current may be about 5 A to 20 A. For the extraction cases, the base current may be about 5 A to 20 A.

In yet still other cases, though not specifically shown, the constant current sources may themselves be adjustable, and thus the variations with respect to sources of charge carriers in the form of voltage sources are equally applicable to the sources of charge carriers in the form of current sources.

Figure 11:
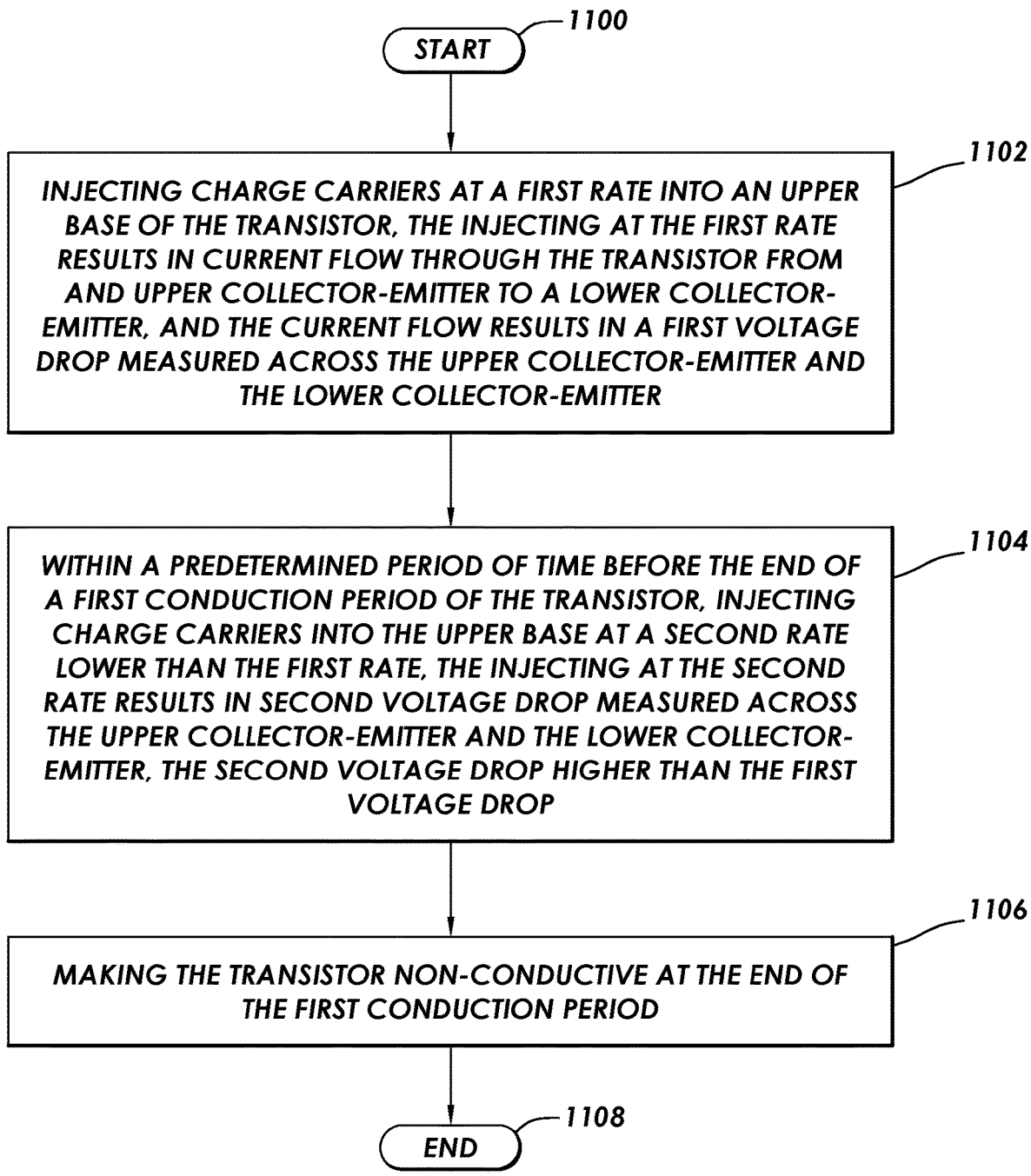
FIG. 11 shows a method in accordance with at least some embodiments.

FIG. 11 shows a method in accordance with at least some embodiments. In particular, the method starts (block 1100) and comprises: injecting charge carriers at a first rate into an upper base of the transistor, the injecting at the first rate results in current flow through the transistor from an upper collector-emitter to a lower collector-emitter, and the current flow results in a first voltage drop measured across the upper collector-emitter and the lower collector-emitter (block 1102); within a predetermined period of time before the end of a first conduction period of the transistor, injecting charge carriers into the upper base at a second rate lower than the first rate, the injecting at the second rate results in second voltage drop measured across the upper collector-emitter and the lower collector-emitter, the second voltage drop higher than the first voltage drop (block 1104); and making the transistor non-conductive at the end of the first conduction period (block 1106). Thereafter, the method ends (block 1108), likely to be restarted in the next conduction period.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method comprising:
changing conductive state of a bi-directional double-base bipolar junction transistor from non-conductive to conductive for a first conduction period by:
injecting charge carriers at a first rate into an upper base of the transistor; and then
injecting charge carriers at a second rate into the upper base, the second rate lower than the first rate, and the injecting charge at the second rate results in a first voltage drop from an upper collector-emitter to a lower-collector emitter.

2. The method of claim 1 wherein the first voltage drop is less 0.2 Volts or less.

3. The method of claim 1 further comprising injecting charge carriers into a lower base of the transistor, and then electrically floating the lower base of the transistor.

4. The method of claim 1 further comprising making the transistor non-conductive to end the first conduction period by coupling a lower base of the transistor to the lower collector-emitter of the transistor, and extracting charge carriers from the upper base.

5. The method of claim 4 further comprising, after extracting charge carriers from the upper base, electrically floating the upper base.

6. The method of claim 1 further comprising making the transistor non-conductive to end the first conduction period by extracting charge carriers from the upper base and extracting charge carriers from a lower base.

7. The method of claim 6 further comprising, after extracting charge carriers from the upper base and extracting charge carriers from the lower base, electrically floating the upper base and coupling the lower base to the lower collector-emitter.

8. The method of claim 1 further comprising:
making the transistor non-conductive to end the first conduction period; and then changing conductive state of the transistor from non-conductive to conductive for a second conduction period by:
injecting charge carriers at a third rate into a lower base of the transistor; and then
injecting charge carriers into the lower base at a fourth rate lower than the third rate.

9. The method of claim 8 further comprising, during the injecting charge carriers at the third rate, injecting charge carriers into the upper base of the transistor.

10. A method comprising:
changing conductive state of a bi-directional double-base bipolar junction transistor from conductive to non-conductive to end a first conduction period by:
extracting charge carriers from an upper base of the transistor; and then
electrically floating the upper base;
after the end of the first conduction period, changing conductive state of the of the transistor from non-conductive to conductive for a second conduction period by:
injecting charge carriers at a first rate into the upper base of the transistor; and then
injecting charge carriers into the upper base at a second rate lower than the first rate.

11. The method of claim 10 further comprising injecting charge carriers into a lower base of the transistor.

12. A switch assembly comprising:
a bipolar junction transistor defining an upper base, an upper collector-emitter, a lower base, and a lower collector-emitter;
a driver defining an upper-base terminal coupled to the upper base, an upper-conduction terminal coupled to the upper collector-emitter, a lower-base terminal coupled to the lower base, and a lower-conduction terminal coupled to the lower collector-emitter;
wherein the driver changes state of the transistor from an off mode to a transistor-on mode for a first conduction period by being configured to inject charge carriers into the upper base at a first rate, and then inject charge carriers into the upper base at a second rate lower than the first rate.

13. The switch assembly of claim 12 wherein, during the injection of charge carriers into the upper base at the first rate, the driver is further configured to inject charge carriers into the lower base and then electrically float the lower base.

14. The switch assembly of claim 12 wherein the driver is further configured to transition to a subsequent off mode of the transistor to end the first conduction period by being configured to couple the lower base to the lower collector-emitter and extract charge carriers from the upper base.

15. The switch assembly of claim 14 wherein, after the extraction of charge carriers from the upper base, the driver is further configured to electrically float the upper base.

16. The switch assembly of claim 12 wherein the driver transitions the transistor to a subsequent off mode to end the first conduction period by being configured to extract charge carriers from the upper base and extract charge carriers from the lower base.

17. The switch assembly of claim 16 wherein, after the extraction of charge carriers from the upper base and the extraction of charge carriers from the lower base, the driver is further configured to electrically float the upper base and directly couple the lower base to the lower collector-emitter.

18. A switch assembly comprising:
a bipolar junction transistor defining an upper base, an upper collector-emitter, a lower base, and a lower collector-emitter;
a driver defining an upper-base terminal coupled to the upper base, an upper-conduction terminal coupled to the upper collector-emitter, a lower-base terminal coupled to the lower base, and a lower-conduction terminal coupled to the lower collector-emitter;
wherein the driver changes state of the transistor from a transistor-on mode to an off mode to end a first conduction period by being configured to extract charge carriers from the upper base, and then electrically float the upper base;
wherein, after the end of the first conduction period, the driver is further configured to change conductive state of the transistor from the off mode to the transistor-on mode by being configured to: inject charge carriers at a first rate into the upper base of the transistor; and then inject charge carriers at a second rate into the upper base, the second rate lower than the first rate.

19. The switch assembly of claim 18 wherein, during the injection of charge carriers at the first rate, the driver is further configured to inject charge carriers into the lower base of the transistor.

\* \* \* \* \*

UNITED STATES PATENT AND TRADEMARK OFFICE
CERTIFICATE OF CORRECTION

PATENT NO. : 11,804,835 B2
APPLICATION NO. : 17/530981
DATED : October 31, 2023
INVENTOR(S) : Alireza Mojab It is certified that error appears in the above-identified patent and that said Letters Patent is hereby corrected as shown below:

In the Claims

Column 25, Claim 2, Line 47, "less 0.2 Volts or less" should be --0.2 Volts or less--

Signed and Sealed this
Third Day of September, 2024

Katherine Kelly Vidal
*Director of the United States Patent and Trademark Office*